United States Patent
Aizikov et al.

(10) Patent No.: US 10,840,073 B2
(45) Date of Patent: Nov. 17, 2020

(54) METHODS AND APPARATUS FOR OBTAINING ENHANCED MASS SPECTROMETRIC DATA

(71) Applicants: Konstantin Aizikov, Bremen (DE); Dmitry Grinfeld, Bremen (DE)

(72) Inventors: Konstantin Aizikov, Bremen (DE); Dmitry Grinfeld, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 914 days.

(21) Appl. No.: 13/829,562

(22) Filed: Mar. 14, 2013

(65) Prior Publication Data

US 2013/0311110 A1 Nov. 21, 2013

(30) Foreign Application Priority Data

May 18, 2012 (EP) .................................... 12168516

(51) Int. Cl.
*G01N 15/00* (2006.01)
*G01N 15/02* (2006.01)
(Continued)

(52) U.S. Cl.
CPC ........ *H01J 49/0036* (2013.01); *G06K 9/0053* (2013.01); *H01J 49/38* (2013.01); *G01R 33/4625* (2013.01)

(58) Field of Classification Search
CPC ........ H01J 49/00; H01J 49/0036; H01J 49/38; G06K 9/0053; G01R 33/4625
(Continued)

(56) References Cited

U.S. PATENT DOCUMENTS 4,899,386 A * 2/1990 Ichikawa ................ G10L 19/02
704/205
5,886,346 A 3/1999 Makarov
(Continued)

FOREIGN PATENT DOCUMENTS

JP 2005-091344 A 4/2005
JP 2012-008066 A 1/2012
WO 2012/080352 A1 6/2012

OTHER PUBLICATIONS

Jozef Voros "Iterative Algorithm for Parameter Identification of Hammerstein Systems with Two Segment Nonlinearities", IEEE Transactions on Automation Control, vol. 44, No. 11, Nov. 1999.*
(Continued)

*Primary Examiner* — Alexander Satanovsky
*Assistant Examiner* — Douglas Kay
(74) *Attorney, Agent, or Firm* — Thomas F. Cooney

(57) ABSTRACT

A method comprising decomposing mass spectrometry data, especially of ion species that undergo multiple direction changes in a periodic manner, the data comprising signal and noise measured over time, into a sum of K harmonic component signals and a noise component, wherein the harmonic component signals and their number K are derived from the data and a determined quantity representative of the noise. The harmonic component signals and their number K may be determined iteratively on the basis of: using an initial value of K to calculate a minimised non-negative measure of difference $R^{(K)}$ between the measured and model data comprising data sets of K-harmonic component signals, and if $R^{(K)}$ does not lie within a noise range based on the quantity representative of the noise, changing the value of K and recalculating $R^{(K)}$ until $R^{(K)}$ lies within the noise range. Mass spectral information may be derived from the model data set.

16 Claims, 14 Drawing Sheets

(51) Int. Cl.
*G01N 15/06* (2006.01)
*G01N 15/10* (2006.01)
*H01J 49/00* (2006.01)
*G06K 9/00* (2006.01)
*H01J 49/38* (2006.01)
*G01R 33/46* (2006.01)

(58) Field of Classification Search
USPC .......................... 702/19, 23, 27, 32; 250/282
See application file for complete search history.

(56) References Cited

U.S. PATENT DOCUMENTS

| | | | |
|---|---|---|---|
| 6,872,938 | B2 | 3/2005 | Makarov et al. |
| 9,520,280 | B2* | 12/2016 | Makarov ............... H01J 49/027 |
| 2004/0238755 | A1* | 12/2004 | Lee ....................... H01J 49/147 250/423 R |
| 2006/0005640 | A1* | 1/2006 | Osaka .............. G01N 35/00871 73/863.83 |
| 2008/0197275 | A1* | 8/2008 | Mordehai ........... H01J 49/0095 250/287 |
| 2008/0270083 | A1 | 10/2008 | Lange et al. |
| 2009/0278037 | A1* | 11/2009 | Grothe, Jr. .......... H01J 49/0036 250/282 |
| 2011/0240845 | A1* | 10/2011 | Ding ................... H01J 49/4245 250/282 |
| 2011/0251801 | A1* | 10/2011 | Misharin ................. H01J 49/38 702/32 |
| 2011/0278449 | A1* | 11/2011 | Boecker ............. G01N 33/6848 250/282 |
| 2013/0013274 | A1* | 1/2013 | Grothe, Jr. .......... H01J 49/0036 703/2 |
| 2013/0068942 | A1* | 3/2013 | Verenchikov ....... H01J 49/4245 250/282 |
| 2013/0131998 | A1* | 5/2013 | Wright ............... G01N 30/8675 702/27 |

OTHER PUBLICATIONS

E. J. Vladislavleva and et al. "Order of Nonlinearity as a Complexity Measure for Models Generated by Symbolic Regression via Pareto Genetic Programming", IEEE Transactions on Evolutionary Computation, vol. 13, No. 2, Apr. 2009.*
K. Meyer, "Estimating covariance functions for longitudinal data using a random regression model", Genet. Sel. Evol. 30 (1998) 221-240 © Inra/Elsevier, Paris.*
M. Barber and et al, "Fast Atom Bombardment of Solids (F.A.B.) : A New Ion Source for Mass Spectrometry", J.C.S. Chem. Comm., 1981.*
A. G. Marshall, "Fourier Transform ion cyclotron resonance mass spectrometry: a primer", Mass Spectrometry Reviews, 1998, 17, 1-35 q 1998 by John Wiley & Sons, Inc.*
Vladimir V. Tolstikov and et al. "Analysis of Highly Polar Compounds of Plant Origin: Combination of Hydrophilic Interaction Chromatography and Electrospray Ion Trap Mass Spectrometry", Analytical Biochemistry 301, 298-307 (2002).*
W. C. Wiley and et al, "Time-of-Flight Mass Spectrometer with Improved Resolution", Rev. Sci. Instr. vol. 26, No. 12, Dec. 1995.*
N. Na and et al. "Development of a Dielectric Barrier Discharge Ion Source for Ambient Mass Spectrometry", J Am Soc Mass Spectrom 2007, 18, 1859-1862) © 2007 American Society for Mass Spectrometry.*
T.C. Farrar and et al. "Application of Linear Prediction to Fourier Transform Ion Cyclotron Resonance Signals for Accurate Relative Ion Abundance Measurements", Anal. Chem. 1992, 64, 2770-2774.*
J. Chen, "The Filter Diagonalization Method", https://www.physics.uci.edu/-jianhanc/fdm.html, Jun. 21, 2001.*
G.E. Christensen, "Consistent Image Registration", IEEE Transactions on Medical Imaging, vol. 20, No. 7, Jul. 2001.*
M.W. Woolrich and et al, "Temporal Autocorrelation in Univariate Linear Modeling of FMRI Data", NeuroImage 14, 1370-1386 (2001).*
Burger et al., "A Survey on Level Set Methods for Inverse Problems and Optimal Desicn," UCLA Mathematics Department (2004), ftp://ftp.math.ucla.edu/pub/camreport/cam04-02.pdf, XP055041321, pp. 1-68.
Manolakis et al., "Statistical and Adaptive Signal Processing," Artech House Inc., Norwood, US (2005), XP002685386, pp. 478-493.
Manolakis et al., "Statistical and Adaptive Signal Processing," Artech House Inc., Norwood, US (2005), XP002685386, pp. 445-462.
Anonymous: "sclean", "STSDAS Help Pages: stsdas.analysis. restore," Space Telescope Science Institute (2011), http://stsdas.stsci.edu/cgi-bin/gethelp.cgi?sclean, XP=002685387, pp. 1-2.
Amster, "Special Feature: Tutorial—Fourier Transform Mass Spectrometry", Journal of Mass Spectrometry, vol. 31 (1996), pp. 1325-1337.
De Hoffmann, et al., "Mass Spectrometry: Principles and Applications", 3rd Edition, ISBN: 978-0-470-03310-4, (2007), pp. 122-126, and 157-164.
Makarov, "Electrostatic Axially Harmonic Orbital Trapping: A High-Performance Technique of Mass Analysis," Anal. Chem. 2000, 72, pp. 1156-1162.
Marshall, et al., "Fourier transform ion cyclotron resonance detection: principles and experimental configurations," International Journal of Mass Spectrometry 215 (2002), pp. 59-75.
Marshall, et al., "Fourier Transform Ion Cyclotron Resonance Mass Spectrometry: A Primer", Mass Spectrometry Reviews, 1998, 17, pp. 1-35.
Scigelova, et al., "Fourier Transform Mass Spectrometry," Mol. Cell. Proteomics (2011), 10(7):M111.09431. DOI:10.1074/mcp. M111.009431, pp. 1-19.
"Data-Independent Aquisition", Wikipedia. Retrieved on Apr. 5, 2020, https://en.wikipedia.org/wiki/Data-independent_acquisition, 3 pages.
"Tandem Mass Spectrometry", Wikipedia. Retrieved on Apr. 3, 2020, https:https://en.wikipedia.org/wiki/Tandem_mass_spectrometry, 5 pages.

* cited by examiner

METHODS AND APPARATUS FOR OBTAINING ENHANCED MASS SPECTROMETRIC DATA

FIELD OF THE INVENTION

This invention generally relates to mass spectrometry, particularly to methods and apparatus for obtaining enhanced mass spectrometric data. An aspect of the invention relates to methods of determining a measure of how many different species of ions are present within a mass analyser within a range of mass-to-charge ratios. Further aspects relate to determining the mass-to-charge ratios and abundances of such ions.

BACKGROUND OF THE INVENTION

Mass Spectrometry (MS) is a widely used analytical technique for characterising atomic and/or molecular compositions by measuring the masses, or more particularly the mass-to-charge ratios, of ionized analytes in an electric and/or magnetic field of a mass analyser.

Among the various types of mass spectrometers, Fourier Transform Mass Spectrometers (FTMS) are known as the instruments providing the highest accuracy, resolution and resolving power. The method of FTMS analysis is based on trapping ions, for instance in a combination of electrostatic and magnetic fields in the case of Fourier Transform Ion Cyclotron Resonance MS (FT-ICR MS), or in solely an electrostatic field in the case of the Orbitrap™ analyser. In both cases, the trapped ions oscillate and induce alternating image charge on detector electrodes with specific frequencies dependent on their respective mass-to-charge ratios (m/z). The resulting image current is amplified, sampled, and recorded.

Historically, a typical FTMS spectrum is obtained by applying a Fourier Transform (FT) to the signal (the so-called "transient") recorded during time T at N temporally equidistant points to obtain a spectrum in the frequency domain. In turn, the frequency is related to the m/z. Fast Fourier Transform (FFT) algorithms are typically used for this processing. The technique treats a transient as a sum of non-decaying harmonic signals and produces a spectrum on an equidistant grid of frequencies separated by $\Delta f_{FT}=1/T$ in the Nyquist frequency band $-N/2T<f\leq N/2T$. Although robust and fast, FT has a frequency resolution uncertainty $\Delta f_{FT}$ which restricts both the precision and resolution of mass measurements and thus limits the overall quality of the mass spectra. Furthermore, FT does not provide explicit information about the decay rate of any harmonic component of a spectrum, which degrades the accuracy of the ion abundances in the mass spectra. Since FT utilises interfering harmonic waveforms, it produces spectra which might have different intensities for closely separated peaks compared to MS methods utilising direct detection of ion beams such as Time-Of-Flight (TOF) MS.

The aforementioned shortcomings of FT are the tradeoffs against its advantages. To address the drawbacks, improvements have been devised that take advantage of certain properties of the recorded FTMS signal.

Lange and Senko describe in EP2372747 a method that capitalises on the phase correlation in the FTMS signal to obtain more accurate FT amplitude spectra in so-called absorption mode. Although the resulting spectral peaks are somewhat narrower and side-lobes are suppressed, this method still fails to provide resolution beyond the FT uncertainty described above. Moreover, the phase-corrected FT algorithm employed requires exact knowledge of the expected signal phase, which is not always a priori known for FTMS signals and is not necessarily preserved throughout the entire mass range.

A model-based method has been proposed by R. A. Grothe in US 2009/0278037 A that comprises processing a signal in the frequency domain and involves a least squares approximation of each FT spectral peak of a measured signal with a model signal of an unknown frequency, initial amplitude, phase, and decay. It also utilises the signal's frequency sparseness, which allows isolation of peaks of interest within a narrow frequency window. This method provides much better precision in obtaining all spectral parameters, i.e. phase, amplitude, decay, and frequency. The frequency accuracy is not restricted to 1/T for any peak separated from the other by at least several FT data bins. Although a generalisation of the method to the case of K peaks that overlap in the FT domain is straightforward, it necessarily leads to a non-linear problem of finding K sets of individual spectral parameters. Moreover, in order to solve this problem, any numerical algorithm requires an a priori knowledge of the value K and close initial approximations of frequencies. Therefore, in practice this method does not provide peak resolution better than 1/T.

Another approach recently introduced is the Filter Diagonalization Method (FDM) [3,4], as described in Mandelshtam V. A., *Progress in Nuclear Magnetic Resonance Spectroscopy,* 38, 159-196 (2001) which has been described in relation to the field of FTMS in Aizikov, K. and P. B. O'Connor, *Journal of the American Society for Mass Spectrometry,* 17(6), 836-843 (2006). FDM represents an attempt to bypass the limitations imposed by the FT equidistant frequency grid and go beyond the consequently imposed uncertainty. The technique introduces a special auxiliary quasi-quantum dynamic system with a not self-conjugate Hamiltonian operator, which is then diagonalized to find the complete set of frequencies. The FDM can be also reformulated as utilising the auto-correlative nature of FTMS transients that means that each successive intensity value in a transient can formally be represented as a linear combination of values at previous time-points. Typically operating on discrete "pseudo-transient" signals reconstructed from narrow frequency band FT windows by means of inverse FT, FDM decomposes a discrete signal in the time domain represented by N temporally equidistant complex data points into a sum of N/2 decaying harmonic components (sinusoids), each of them characterized by a complex frequency and complex amplitude.

FDM succeeds in providing mass peak resolution superior to that of FFT. However, FDM realises exact collocation of a measured, i.e. noisy, FTMS signal with a number (N/2) of harmonics that significantly exceeds the number of unique ion spices in the mass analyser, thus making no allowance for noise. Since a measured signal typically contains significant noise and given the sparse nature of FTMS signals, the degeneracy introduced by the excessive number of harmonic components leads to instabilities in the method that manifest themselves in spurious peaks, peak splitting and other undesirable artifacts which are difficult to separate from real peaks.

Other methods under the so-called Linear Prediction (LP) scheme that rely on the auto-correlative properties of FTMS transients have been described for bypassing the FT uncertainty, as in, for example, T. C. Farrar, J. W. Elling and M. D. Krahling *Anal. Chem.* 64 2770-2774 (1992), S. Guan, A. G. Marshall *Analytical Chemistry* 69(6), 1156-1162 (1997), and the Maximum Entropy Method (MEM) (see, for example, A. Rahbee *International Journal of Mass Spectrometry and Ion Processes* 72(1-2), 3-13 (1986) and Z. Zhang, S. Guan and A. G. Marshall *Journal of the American Society for Mass Spectrometry* 8(6), 659-670 (1997)). These methods reduce the degeneracy of FDM by approximating, rather than collocating exactly as with FDM, the measured time domain signal as a linear combination of a typically smaller than N/2 number of exponentially decaying harmonics (sinusoids). An approximate number of harmonics has to be known a priori or guessed. The problem is hence formulated as an over-determined system of linear equations which is solved using the least squares technique. Harmonics that are related to signals from ions can be distinguished from harmonics that are related to noise by their amplitude (see T. C. Farrar et al and Guan and Marshall). Yet, the excessive number of assumed harmonics can lead, similarly to the FDM, to peak splitting and spurious solutions, whereas underestimation of this value of this value degrades resolution.

Although these LP methods can provide a resolution similar to that of FDM with better stability, they still employ a large number of harmonics and are known to work only under low noise conditions since they become increasingly unstable at the elevated noise levels typical associated with FTMS signals. Furthermore, if applied directly to a typical FTMS transient these methods become computationally prohibitively costly, more so than FDM since they are iterative in finding the number of harmonics.

For these types of methods to work efficiently and effectively in practice, it is essential to have an a priori knowledge of the exact number of harmonic components; too few may result in subpar resolution whilst too many may introduce the previously mentioned artefacts, such as spurious peaks. With the LP methods, the number of harmonic components is difficult to estimate.

SUMMARY OF THE INVENTION

The invention has been made against the above background.

Aspects of the invention provide a method of mass spectrometry comprising: providing measured data comprising signal and noise measured over time that has been obtained from species of ions performing multiple changes of direction in a periodic manner within a mass analyser, the species being within a range of mass-to-charge ratios; determining a quantity representative of the noise in the measured data, and determining a model data set of K-harmonic component signals from the measured data; wherein the harmonic component signals and their number K are determined iteratively on the basis of: using an initial value of K to calculate a minimised non-negative measure of difference $R^{(K)}$ between the measured data and model data comprising data sets of K-harmonic component signals, and if $R^{(K)}$ does not lie within a noise range based upon the quantity representative of noise, changing the value of K and recalculating $R^{(K)}$ as many times as necessary until $R^{(K)}$ does lie within the noise range; and, deriving mass spectral information about the ion species from the model data set, the mass spectral information comprising one or more of: a measure of the number of different species of ions; a measure of the mass-to-charge ratio of the species of ions; a measure of the signal intensity of each species of ions.

The invention also provides a method of deriving mass spectral data comprising: deriving a model data set comprising a set of K harmonic component signals from measured data comprising signal and noise measured over time using a mass analyser from different species of ions present within the mass analyser and within a range of mass-to-charge ratios, the ions performing multiple changes of direction in a periodic manner within a range of frequencies within the mass analyser; determining a quantity representative of the noise in the measured data; finding the harmonic components and their number K on the basis of: using an initial value of K to calculate a minimised non-negative measure of difference $R^{(K)}$ between the measured data and model data set comprising a set of K harmonic component signals and if $R^{(K)}$ does not fall within a noise range derived from the quantity representative of the noise, changing the value of K and recalculating $R^{(K)}$ as many times as necessary until $R^{(K)}$ does fall within a noise range derived from the quantity representative of the noise; and deriving mass spectral data from the model data set.

The K harmonic signals are sinusoids with amplitudes and frequencies that may include decay and phase information as described in more detail below. Each amplitude and frequency represents respectively an abundance and mass-to-charge ratio of a different species of ion.

Beneficially, the mass spectral data derived by the invention is of high resolution and resolving power with reduced incidence of spurious solutions and split peaks. The derived mass spectral data may include data representing mass-to-charge ratios of ions and/or data representing the numbers of ions (ion abundances or intensities) having said mass-to-charge ratios. The data representing mass-to-charge ratios of ions may comprise frequency data (e.g. relating to ion periodic motion frequency) and/or the mass-to-charge ratios themselves. Preferably, the mass-to-charge ratios are derived, e.g. from frequencies of the K-harmonic component signals. Conversion of frequencies to mass-to-charge ratios may be performed in any well known manner, for example in a similar way to how it is done in FTMS. Preferably, the ion abundances are derived, e.g. from amplitudes of the K-harmonic component signals. It will be appreciated thus that the derived mass spectral data preferably comprises a mass spectrum. The derived mass spectral data may be of a limited or narrow range of mass-to-charge ratios. The method, however, is preferably repeated a plurality of times to derive mass spectral data of a wider range of mass-to-charge ratios. In other words, the derived mass spectral data may relate to a window of mass-to-charge ratios, that is preferably limited or narrow, and the method may be repeated a plurality of times to derive data for a plurality of such windows of mass-to charge ratios, each window covering a different range of mass-to-charge ratios, although the windows may overlap. Thus, a limited range mass spectrum may be derived on the basis of each such window and a wider or full range mass spectrum may be derived on the basis of a plurality of such windows.

Viewed in another aspect, the invention can be seen to provide a method of mass spectrometry comprising decomposing measured data comprising signal and noise measured over time using a mass analyser into a sum of K harmonic component signals and a noise component, wherein the harmonic component signals and their number K are derived from the measured data and a determined quantity representative of the noise in the measured data.

The invention also provides various methods of mass spectrometry as hereinafter described comprising the steps of the method of determining a measure of how many different species of ions are present within a mass analyser or the method of deriving mass spectral data. The methods are preferably methods of Fourier transform (FT) mass spectrometry, i.e. they may be performed using measured data acquired on an FT mass spectrometer.

Another aspect of the invention provides a system for determining mass spectral information about species of ions present within a mass analyser and within a range of mass-to-charge ratios, each species having a different mass-to-charge ratio, comprising: a computer having an input for receiving measured data comprising signal and noise measured over time that has been obtained using a mass analyser from different species of ions present within the mass analyser and within a range of mass-to-charge ratios, the ions performing multiple changes of direction in a periodic manner within a range of frequencies within the mass analyser, and an output for outputting the mass spectral information derived by the computer from the measured data; wherein the computer is programmed with a program comprising: one or more modules of program code for deriving a model data set comprising a set of K harmonic component signals from the measured data; and one or modules of program code for finding the harmonic component signals and their number K iteratively on the basis of: using an initial value of K to calculate a minimised non-negative measure of difference $R^{(K)}$ between the measured data and model data set comprising a set of K harmonic component signals, and changing the value of K and recalculating $R^{(K)}$ as many times as necessary until $R^{(K)}$ lies within a noise range derived from a determined quantity representative of the noise.

Another aspect of the invention provides a system for deriving mass spectral data comprising: a computer having an input for receiving measured data comprising signal and noise measured over time using a mass analyser from different species of ions present within the mass analyser and within a range of mass-to-charge ratios, the ions performing multiple changes of direction in a periodic manner within a range of frequencies within the mass analyser, and an output for outputting mass spectral data derived by the computer from the measured data; wherein the computer is programmed with a program comprising: one or more modules of program code for deriving a model data set comprising a set of K harmonic component signals from the measured data; one or modules of program code for finding the harmonic component signals and their number K on the basis of: using an initial value of K to calculate a minimised non-negative measure of difference $R^{(K)}$ between the measured data and model data set comprising a set of K harmonic component signals, and changing the value of K and recalculating $R^{(K)}$ as many times as necessary until $R^{(K)}$ lies within a noise range derived from a determined quantity representative of the noise; and one or more modules of program code for deriving mass spectral data from the model data set.

The system may further comprise an input for the predetermined noise power, or the computer program may further comprise a module for predetermining the quantity representative of the noise, e.g. by evaluating noise on the measured signal. The system may form part of a mass spectrometry system, e.g. further comprising the mass analyser.

A further aspect of the invention provides a computer program having modules of program code for carrying out the method of the present invention (i.e. when the program is executed on a computer), more specifically for carrying out the data processing steps.

A still further aspect of the invention provides a computer readable medium carrying the computer program. The medium is to be read by a computer such that the program can be executed on the computer.

The method may be used to determine a measure, K, of the number of different species of ions present within a mass analyser within a range of mass-to-charge ratios, the ions being present in the analyser at least when the measured data is collected from them, the ions performing multiple changes of direction within the analyser in a periodic manner. Preferably the ions follow a flight path comprising oscillations or rotations within the analyser. The ions thereby perform multiple changes of direction in a periodic manner at frequencies within the mass analyser, the frequencies of periodic motion being related to the mass-to-charge ratios of the ions. Thus, the different species of ions present within the mass analyser having different mass-to-charge ratios within a range of mass-to-charge ratios will undergo periodic motion within a range of frequencies. A detector is used to detect the passage of ions within the analyser. Preferably the method of detection utilises image currents induced within detection electrodes positioned close to at least a portion of the flight path. The image currents thus induced may contain harmonics of the frequencies of periodic motion of the ions, or may, depending upon the geometry of the detection electrodes, comprise pulses at frequencies related to the frequencies of motion of the ions. The ions may remain in the analyser while the method is being performed, for example if the method is performed on-the-fly, but more likely the ions will no longer be present in the analyser as they will typically be removed once the measured data has been collected and as they are not required to remain present in the analyser whilst the method determines the harmonic component signals and their number K and performs any other data processing operations such as determining a mass spectrum from the data. Thus, it is not material to the operation of the invention whether the ions are present in the analyser while the method is being performed.

The measured data is typically a transient signal (sometimes referred to herein simply as a "transient"), e.g. as obtained from an FTMS mass analyser. The measured data may be derived using a method employing image current detection, or any other method which detects the periodic motion of charged particles within a mass analyser. For many of its preferred embodiments as described below, the invention may take advantage of one or more properties of a typical transient signal. A first such property is that the signal is sparse in the frequency domain, which means that the number of acquired signal values N usually far exceeds the number of harmonic components (equal to the number of ion species with unique mass to charge ratios simultaneously present in an analyzer). Another such property is that the noise power on the signal can be treated as being substantially constant within a narrow frequency window. Still another property is the autocorrelation property of the signal, namely that the value of the signal at a given point in time can be expressed as a combination of values of the signal at previous or succeeding time points. A further such property is that the phases of ion oscillation are usually correlated with the moment of ion injection in, for example, an Orbitrap analyser or ion excitation in an FT-ICR analyser. A still further such property is that the decay constants of the harmonic signals are predictable in most cases. Not all embodiments of the invention rely on these properties however. Some aspects rely on only a single constraint that the noise power is substantially constant within the frequency range corresponding to the range of mass-to-charge ratios, as will be further described.

A typical transient signal decays exponentially from an initial amplitude, usually due at least in part to ion-background gas collisions causing a reduction in the oscillating ion population within the mass analyser. Some aspects of the present invention make use of the decay properties of a transient; others may be used with a steady transient having zero decay.

The measured data, because it is real data, comprises both signal and noise. The quantity representative of the noise is a value representing the noise that is determined and used as a reference to find the optimum value of K. It is preferably the noise power derived from the spectral noise power. The quantity representative of the noise may be an evaluated or measured quantity or it may simply be a value that is set. The quantity is preferably a measured or evaluated quantity. Thus, the invention preferably comprises measuring or evaluating a quantity representative of the noise on the measured data. The noise may be evaluated from the measured data being used to derive the model data (i.e. the measured data under analysis), or it may be evaluated from one or more sets of previous or subsequent measured data (e.g. in a calibration procedure). Thus, the noise power is generally known or can be measured from calibration data (e.g. a calibration transient) acquired separately from the measured data (e.g. measured transient). Noise power may be determined from the actual measured data, for example, by statistical analysis of the measured data. However, preferably the quantity representative of the noise, e.g. noise power, is, for example, measured from calibration data (e.g. a calibration transient acquired with no ions purposely present in the detecting volume of the analyser). The determined quantity representative of the noise can be measured in this way and the noise determined for the frequency window under analysis (i.e. the frequency window in the measured data). The measured noise in this way typically varies as a function of frequency but is typically constant and is preferably assumed constant for the frequency window in the measured data. The noise may be determined as a characteristic of the preamplifier, e.g. as a known smooth function of frequency.

In certain preferred embodiments, therefore, the quantity representative of the noise is determined by a method comprising one or more of: evaluating the noise power from the measured data; evaluating the noise power from a previous set of measured data derived from the mass analyser; measuring characteristics of preamplifiers used in the signal measuring apparatus of the mass analyser; setting a noise power on the basis of prior knowledge of the mass analyser.

Typically, the noise on the measured data has a substantially constant spectral density and comprises noise components at each measured data point which are statistically independent and normally distributed having zero mean and a dispersion related to the spectral noise power, the spectral noise power being substantially constant over the measured data set, at least in a narrow frequency window. The robustness of the invented method demonstrates itself in an ability to derive the model signal from noisy transients beyond FT uncertainty.

Overall the invention can be seen to reside in fitting a model data set to measured data, which herein means mathematically fitting, taking into account the noise on the measured data. The step of determining the noise power and using the determined noise power in finding the most probable number K of harmonic signals in the model set is a different approach to the prior art methods, such as the FDM, which does not account for noise and solves the problem on the basis of a large K, i.e. K=N/2. Other linear prediction methods approximate the measured data with the model data and so have a residual difference between them but the residual is not correlated to a determined noise power of the measured data to find K. On the contrary, the prior art approach of minimising K (as close to zero as possible) will not find the most probable K since real noise in the measured data is not negligible. Other prior art methods attempt to fit K harmonic signals to measured data containing noise and, having found a multitude of such K-harmonic signals, face the problem of distinguishing which of them model harmonic signals originating from ion motion within the mass analyser and which of them are harmonic signals which are effectively fitted to noise components. The present invention on the other hand, by taking account of a realistic measure of noise and purposely using it to find the most probable K, preferably fits a minimum number of K-harmonic signals to the measured data without significantly thereby fitting harmonic signals to measured noise. The method is a robust method that results in fewer spurious peaks and artefacts whilst being computationally highly efficient since it does not involve calculations with a larger number of terms than is necessary, K being much smaller than N. The method advantageously doesn't require any input of additional computational parameters except for a determined noise measurement, which itself may optionally be determined from the measured data.

It may be convenient to perform the methods of the present invention using measured data comprising information on a limited range of mass-to-charge ratios in which case, optionally, the range of mass-to-charge ratios may be limited and selected from a larger data set.

In preferred embodiments, the invention uses Fourier Transform (especially FFT) of the measured transient signal, i.e. the measured data, followed by windowing the transformed signal in a number (one or more) of relatively narrow frequency intervals before transforming each window of data back to the time domain to be processed independently, optionally in parallel. Each window typically at least partially overlaps its neighbouring window or windows. Alternatively other known methods for deriving a frequency spectrum from a measured transient may be used.

By way of further explanation, the full measured data set as detected by the mass analyser contains signals from all the ions present in the mass analyser. This may comprise a large number of different mass-to-charge ratios spread over a wide range, i.e. with a large number of peaks in the mass spectrum. In order to simplify computation and to take advantage of the property of constant noise in a narrow frequency window, the measured data preferably is windowed or filtered so it contains data only from ions of a narrow or selected range of mass-to-charge ratios selected from ions of a wider range of mass-to-charge ratios present in the mass analyser. In other words, the measured data, on which the method of the invention is preferably performed, preferably consists of signals from the ions of the narrow or selected range, together with noise, the measured data thus being a selection from a larger data set with a frequency range corresponding to a limited mass-to-charge range.

Given the sparseness and highly localized nature of FTMS signals in the Fourier transform spectrum, subdividing the whole spectrum into relatively narrow windows (preferably overlapping) to be analyzed individually does not introduce noticeable artefacts whilst substantially reduces both computational time and hardware resources. The measured data thus is preferably windowed or filtered, i.e. to contain only information on ions in a limited or narrow range of mass-to-charge ratios. It is frequency filtered or windowed so as to only contain signals with frequencies in a narrow range corresponding to the frequency window and the corresponding ions of selected mass-to-charge ratio. Among other options, a simple rectangular window is the most beneficial for this purpose. Such windowing, however, may not be necessary in every application. For example, such windowing may not be required where there are only a few peaks in the whole spectrum.

Thus, the method preferably operates on "pseudo-transient" signals (or "windowed" signals) as the measured data, which have been reconstructed from narrow frequency band FT windows by means of inverse FT. The method can then be repeated on a plurality of such narrow or selected ranges ("windows") in order to obtain the desired data (e.g. frequency, mass-to charge ratio and/or abundance) for all ions of interest. That is, the method is performed in such cases on a plurality of such pseudo-transients or windowed signals, optionally in parallel.

The filtered measured data from the narrower range of mass-to-charge ratios is preferably selected from the larger data set by a method comprising: taking a Fourier transform of the larger measured data set (entire transient) to form a transformed data set (i.e. a spectrum in the frequency domain); selecting data in a range of frequencies (i.e. a frequency window) in the frequency domain spectrum of the transformed data set to form a transformed data subset; and transforming the transformed data subset (e.g. by inverse FT) back into the time domain to form the filtered measured data. More specifically, such a method comprises selecting a range of frequencies in the Fourier transform spectrum comprising N subsequent Fourier coefficients; and taking the inverse Fourier transform of the selected range of Fourier coefficients to form a time-domain windowed signal comprising N complex-value data points $c_0, \ldots, c_{N-1}$.

Methods of the present invention may be used to provide mass spectral information from a first set of windowed data sets whilst other methods may be used to provide mass spectral data on a second set of windowed data sets. The first and second windowed data sets may overlap. The mass spectral information from the first set and the mass spectral information from the second set may be combined or stitched together to form an augmented set of mass spectral information. The other methods could be Fourier transform for example.

Unlike known methods of harmonic inversion, the invention treats the measured data as the sum of the "true" signal and the noise, both of which are initially unknown. However, in the method of the invention the noise is accounted for by determining a noise power as herein described. The "true" signal is then obtained from the model data set derived from the measured data taking into account the determined noise.

The ions typically comprise ions having a plurality of mass-to-charge ratios. Each mass-to-charge ratio gives rise to periodic ion motion at a characteristic frequency related to the mass-to-charge ratio. Thus, each type of ion of a given mass-to-charge ratio provides a signal detected in the time domain with a characteristic frequency. The measured data is a sum of these individual signals of characteristic frequency, and noise.

The measured data is measured using the mass analyser from the periodic motion of ions within the mass analyser, typically by image current detection in a detecting volume of the analyser. The measured data is thus typically a transient, more preferably wherein the measured data is recorded at substantially constant time periods. Since the mass analyser may be a known type of mass analyser, typically an FTMS mass analyser, the specific details of the analyser are not given herein as they will be apparent to a person skilled in the art. Instead only general details of the analyser will be given. It will be appreciated that the invention may relate to mass spectrometry employing a single stage of mass analysis, or two stages of MS (i.e. MS/MS analysis), or further stages of MS (i.e. MS$^n$ analysis). That is, the measured data may be from any one or more stages of mass analysis.

Prior to analysis in the mass analyser, ions are typically produced first and then introduced into the mass analyser for detection. The invention preferably comprises producing ions in an ion source of a mass spectrometer. The ion source may be, for example, any suitable known ion source such as, for example, a MALDI source, electrospray ionisation (ESI) source etc. The sample or samples from which the ions are produced in the ion source may originate from any suitable source, for example a liquid chromatograph (LC). The ions to be analysed in the mass analyser may comprise, for example, ions of biological analytes such as proteins, peptides, lipids, pharmaceuticals and/or metabolites etc., as well as non-biological analytes. The invention is especially useful in proteomics where the ions are typically of peptides from the digest of a mixture of proteins and where high resolution and stability of the mass spectrum are particularly required.

The produced ions, which are to be analysed, are preferably directed into a mass analyser using an ion injector. The ion injector may comprise one or more of an ion trap, an ion accelerator and the like. A curved linear ion trap (C-trap) is a suitable ion injector for an Orbitrap™ mass analyser. The mass analyser is preferably one in which the ions undergo oscillations or rotations, especially oscillations or rotations at a frequency which depends upon their mass-to-charge ratio (m/z).

The mass analyser is preferably a mass analyser for Fourier transform mass spectrometry (FTMS). Examples of such analysers include electrostatic trapping mass analysers, such as electrostatic orbital trapping mass analysers (preferably an Orbitrap™ mass analyser) and FT-ICR mass analysers.

The measured data is data measured in the time domain from motions of ions within a mass analyser. The mass analyser preferably comprises an image current detector, e.g. one or more electrodes (especially a pair of electrodes), to detect the ions in the analyser and the method accordingly preferably comprises detecting an image current induced by the motion of the ions in the mass analyser to provide a transient signal as the measured data. The measured data or image current is detected over a period of time T, especially at a multiple time points $t_n$ over the period of time T (n=1 . . . N where N is the total number of digitised data points in the signal). The detector thus detects the image current as a signal $S(t_n)$ in time (i.e. as a transient), which is measured. The measured data is thus preferably an image current signal.

The measured signal is preferably amplified, e.g. using a pre-amplifier, as known in the art. As mentioned, the measured signal $S(t_n)$ is preferably digitised at moments of time $t_n$ (n=1 . . . N). The measured data is thus preferably recorded at substantially constant time periods, i.e. at temporally equidistant data points. A digitiser (A/D) is typically employed for this purpose. The moments of time $t_n$ preferably constitute an arithmetic progression, i.e. are equidistant. The total recording or sampling time of the observed signal being T, the sampling rate is thus given by N/T.

Whilst suitable mass analysers have thus been described, it will be appreciated that the method of the present invention may be applied to measured data in the time domain which emanates from as yet unknown mass analysers, as long as the measured data is, or may be converted into, data in which each ion having a given mass-to-charge ratio had periodic ion motion within the mass analyser at a characteristic frequency related to the mass-to-charge ratio at the time the measured data was acquired.

According to a further aspect of the present invention there is provided a mass spectrometer comprising: an ion source for forming ions of different mass-to-charge ratios from sample material; an ion injector for injecting ions formed by the ion source into a mass analyser, the mass analyser arranged to cause the ions received from the ion injector to undergo periodic motion at frequencies related to the mass-to-charge ratio of the ions; a detection system arranged to detect an image current signal from the ions as they undergo periodic motion; and a processor for receiving measured data comprising signal and noise from the detection system, the processor being configured to determine mass spectral information about the ions formed from sample material using the steps of the method according to the present invention.

Preferably, the measure of difference $R^{(K)}$ is based on a normalized sum of residuals (i.e. differences) between the measured data and the model data at a plurality of data points, more particularly a sum of residual norms (herein also termed simply a residual norm). More preferably, the measure of difference $R^{(K)}$ is a minimised sum of such residuals, especially with respect to a set of autocorrelation coefficients, as described in more detail below. Accordingly, the measure of difference $R^{(K)}$ preferably is a minimum difference. Expressed another way, preferably the measure of difference $R^{(K)}$ is the minimum residual norm of the difference between the measured data and any sum of K harmonic signals.

Preferably a noise range is determined, based upon the determined quantity representative of noise; the noise range preferably includes the quantity representative of noise. The noise range may for example be one of: 0.1 to 10 times the quantity representative of noise; 0.2 to 5 times the quantity representative of noise; 0.5 to 2 times the quantity representative of noise; or any combination of minimum and maximum range values just stated.

In view of the foregoing description, preferably a noise range is determined, the noise range being based upon the determined noise quantity, and the harmonic component signals and their number K are derived from the condition that the minimum norm of the measure of difference $R^{(K)}$ between the measured data and any sum of K harmonic signals lies within the noise range, most preferably from the condition that the minimum norm of the measure of difference $R^{(K)}$ is lower than or equal to the determined noise quantity (wherein the noise range is the determined noise quantity or lower), and the minimal norm of a measure of difference $R^{(K-1)}$ between the measured data and any sum of $K-1$ harmonic signals is higher than the determined noise quantity. According to another preferred criteria, K is derived from the condition that the minimum norm of the measure of difference $R^{(K)}$ between the measured data and any sum of K harmonic signals is the closest in absolute value to the determined noise quantity.

The method may start finding the harmonic component signals and their number K by using any suitable initial value of K. Preferably, K is increased from an initial value of 0 and $R^{(K)}$ is evaluated for each increasing value of K. In other words, using K=0, a minimum measure of difference $R^{(K)}$ is found between the measured data and model data set comprising the set of K-harmonic signals. Then, using K=1, another minimum measure of difference $R^{(K)}$ is found between the measured data and model data set and this is repeated for further values of K (e.g. K=2 etc.), as many times as necessary until, for a given K, $R^{(K)}$ lies within the noise range. Preferably, K is the minimum value for which the measure of difference $R^{(K)}$ equals or preferably becomes less than the noise quantity, typically just less than the noise quantity. Thus, in such preferred embodiments, the value of K is changed and $R^{(K)}$ is recalculated until $R^{(K)}$ equals or becomes less than the noise quantity. In such situations, the $R^{(K)}$ lies within the noise range and is deemed to be substantially equal to the noise quantity.

In another, similar approach, the method of the invention comprises changing the value of K and recalculating $R^{(K)}$ until $R^{(K)}$ becomes the closest value to the noise quantity.

However, whilst less efficient, it is possible to perform the method wherein K is decreased from an initial value and $R^{(K)}$ is evaluated for each decreasing value of K (i.e. until the criteria for finding K is reached). In such embodiments, the method may include situations wherein K is decreased from an initial value which is less than N/2, and more preferably less than N/4, where N is the number of measured data points. In embodiments in which the method assumes free decay of the harmonic signals, the natural upper limit of K (above which $R^{(K)}$ is zero) is N/2, so that K may be decreased from an initial value which is N/2 or less, preferably less than N/2. In embodiments in which the method assumes fixed (especially zero) decay of the harmonic signals, the natural upper limit of K is 2N/3, so that K may decreased from an initial value which is 2N/3 or less, preferably less than 2N/3. Generally, as the number of different species of ions within the mass analyser is very much less than N, the number of iterations required is greater in that case, which is why it is preferred to start from K=0. Furthermore, the method preferably comprises various matrix calculations which are more rapidly and efficiently performed where the number of component signals is small and so it is preferably to obtain the highest computational efficiency to start from K=0.

The method finds K harmonic signals that exceed the determined noise, i.e. the method limits the K harmonic signals sought to those that exceed the determined quantity representative of the noise. Thus, the method finds far fewer K harmonic signals for the model data set than typical prior art methods such as FDM and linear prediction methods. The number K of harmonic signals in the model data set is certainly smaller than the value N/2 that is used in FDM and is preferably less than N/4. On the other hand, the large numbers for K used in FDM and linear prediction methods means that many of the K harmonic component signals in those cases effectively characterise noise thereby leading to spurious peaks. Thus, whilst FDM and linear prediction work in instances of low noise transients, in practice the levels of noise in real FTMS transients means that FDM and linear prediction are severely limited by the production of artefacts. The present invention, however, succeeds in reducing the appearance of artefacts whilst achieving similar levels of high resolution beyond the FT limit.

The method may be implemented wherein an initial value for K is determined by obtaining a frequency spectrum (e.g. by taking a Fourier transform) of the measured data and determining an initial value for K from the number of peaks in the frequency domain spectrum of the transformed data.

Preferably, $R^{(K)}$, being a normalized sum of residuals (also termed herein a sum of residual norms), is described by a term or terms comprising:

$$\min \frac{1}{N} \sum_{n=0}^{N-1} |c_n - c_n^*|^2,$$

where $c_n$ is measured data at each of N data points, and $c^*_n$ is the model data set of K-harmonic signals at each of N data points in the model data set. In other words, the measured data is represented with a number N of complex values $c_n$ at a plurality of data points, the model data that is a sum of K harmonics is represented by the same number N of complex values $c^*_n$ (thus situated on the same temporal grid as $c_n$) and $R^{(K)}$ is the minimum of the norm of their residual or difference ("residual norm") $\|c_n - c^*_n\| = (1/N)\Sigma w_n \|c_n - c^*_n\|^2$ (i.e is the sum of squared absolute values of their differences normalized by N) taken in the space of all possible complex values $c^*_n$ that can be represented as a sum of the K harmonics.

Preferably, in order to minimise the norm of said residual for a given K, the method comprises deriving, more preferably by a method of harmonic inversion, a set or vector of autocorrelation coefficients, a, relating terms $c^*_n$ according to $a_0 c^*_n + a_1 c^*_{n+1} + \ldots + a_K c^*_{n+K} = 0$, where $c^*_n$ is the K-harmonic signal at data points in the model data set and $a_0 \ldots a_K$ are the autocorrelation coefficients. This brings the minimum $R^{(K)} = \min(1/N)\Sigma_{n=0}^{N-1} |c_n - c^*_n|^2$ to the norm of the difference $\|c_n - c^*_n\|$ between the measured signal $c_n$ and the model signal $c^*_n$ that obeys the above autocorrelation condition with a given vector a. The vector of autocorrelation coefficients, $a_k$, is preferably found that minimises the expression $$R^{(K)} = \|c_n - c^*_n\| = \min(N^{-1} \overline{a}^T H(a) a)$$

where H(a) is a Hermitian (K+1)×(K+1) matrix and a is the vector of autocorrelation coefficients.

Thus the above mentioned spectral sparseness and autocorrelation properties of the transient signal can be employed to cast the problem to be solved as one of a non-linear norm residual minimization with respect to the autocorrelation coefficients, which allows feasible and robust numerical solution.

The K harmonic signals are sinusoids with amplitudes and frequencies. Each of the frequencies represents a mass-to-charge ratio of a different species of ion and each of the amplitudes represents an abundance of a different species of ion (the amplitudes being generally proportional to the abundances).

The method of the invention thus preferably comprises deriving mass spectral data from the model data set. The method preferably comprises determining mass-to-charge ratios of ions (i.e. ions in the mass analyser from which the data was measured) from the model data set. The method further preferably comprises determining signal intensities of the ions, i.e. numbers of ions (ion abundances) of each mass-to-charge ratio. Thus, the method of the invention preferably comprises deriving a mass spectrum. The mass spectrum can be either a full or partial (i.e. limited mass-to-charge ratio range) spectrum.

The method preferably comprises determining mass-to-charge ratios of ions from the K harmonic component signals, especially from the frequencies of the K harmonic component signals. The method more preferably comprises determining the mass-to-charge ratios of the K species of ions found using the method from the K harmonic component signals, especially from the frequencies of the K harmonic component signals. The frequencies of the K harmonic component signals are readily found from the autocorrelation coefficients once K has been found.

More preferably, the method further comprises: combining the autocorrelation coefficients, a, in a polynomial equation of the form $a_0 + a_1 \lambda + a_2 \lambda^2 \ldots + a_K \lambda^K = 0$; deriving the frequencies of the K harmonic signals from the roots $\lambda_k$ of the polynomial equation; and translating the frequencies of the K harmonic signals from the frequency domain to the mass-to-charge domain, each of the frequencies thereby describing a mass-to-charge ratio of each of the K species of ions. From the determined mass-to-charge ratios, a mass spectrum can be obtained. It is thus a further feature that a mass spectrum is determined from the K harmonic component signals, especially from the frequencies of the K harmonic component signals.

The method preferably comprises determining an estimate of the number of ions (i.e. the abundance) of each ion species (each mass-to-charge ratio) within the mass analyser, more preferably from the amplitudes of the K-harmonic signals. The roots of the polynomial equation used to find the frequencies can also be used to find the amplitudes. The amplitudes may be found, for example, by minimization of the sum R, where R is of the form $R = (1/N)\Sigma_n |c_n - \Sigma_k A_k(\lambda_k)^n|^2$, and $c_n$ is measured data at each of N data points, as will be further described below. The number of ions of each species is substantially proportional to the absolute value of the complex amplitudes $A_k$. The determined mass spectrum thus preferably contains abundance data, as well as the determined mass-to-charge ratios.

A probabilistic measure is preferably reported for the value K. More preferably, confidence intervals are reported for both real and imaginary component of each of the K reported complex-value frequencies. More preferably, confidence intervals are reported for both real and imaginary component of each of the K reported complex-value amplitudes.

The invention preferably comprises processing the data using a computer (i.e. the invention is preferably computer implemented). A further aspect of the invention thus provides a computer program having modules of program code for carrying out the method of the present invention (i.e. when the program is executed on a computer), more specifically for carrying out the data processing steps. The modules of program code of the computer program are thus devised to execute an algorithm that performs the data processing steps of the method. A still further aspect of the invention provides a computer readable medium carrying the computer program. The medium can be read by a computer such that the program can be executed on the computer.

The computer program and the computer readable medium preferably form part of a computer system, also including a computer, which is made operable by the program to perform the method of the invention and which includes at least one computer processor to execute the program code and perform the method, i.e. the data processing thereof. Processed data may be written to a storage system (e.g. computer memory). The computer system preferably comprises an input interface, e.g. to receive the measured data and/or the determined quantity representative of the noise. The computer system preferably comprises an output interface, e.g. to output the results, such as the peak frequencies, mass-to-charge ratios, ion abundances, mass spectrum etc. The computer system typically has a human user interface to enable a user to change or set certain parameters used by the method.

The method preferably comprises a step of outputting the result, e.g. the mass spectral data, mass spectrum etc. Any of the data acquired, processed or generated, at any of the stages or steps of the method, may be outputted if desired. Outputting means to a resource, i.e. tangible medium. The resource preferably includes at least one human readable resource. Outputting may be to a resource such as a hard copy form, such as paper, or soft copy form such as on a video display. Outputting may be to resource such as a computer readable data storage medium.

According to a yet another aspect of the present invention there is provided a mass analyser under the control of a controller, wherein the controller comprises the computer system and is configured such that the mass analyser is operable to acquire the measured data and input the measured data to the computer system to perform the steps of the method according to the present invention. The computer system of the controller is programmed with the computer program according to the present invention.

The invention enables enhancement of mass spectra by means of accurate and robust signal processing performed on measured MS data, i.e. transient signals, e.g. FTMS signals.

An advantage of the invention lies in providing a mass spectrum of high resolution and resolving power.

Another advantage of the invention lies in an increased stability of a mass spectrum obtained from a measured noisy transient data, i.e. a reduction of spurious peaks, peak splitting and/or other artefacts, compared to the FDM method and other LP methods.

Thus, the invention may enable a high fidelity mass spectrum to be obtained from a measured noisy transient data. This may comprise the determination of all or substantially all statistically significant individual component signals (corresponding to mass-to-charge peaks in the mass spectrum), each of them characterized with a number of parameters, such as frequency, amplitude, decay, and phase, and optionally estimating confidence intervals for one or more of these parameters.

A still further advantage of the invention is that it may be performed with high speed. Hence, the invention may be implemented using one or more high speed signal processing algorithms. Such algorithms may allow real-time processing of data obtained at high acquisition rates from a mass spectrometer, for example that exceed $10^6$ bits/sec, which is typical for contemporary FTMS instruments.

Advantageously, the improvements provided by the invention are obtainable without requiring changes in, for example, sample preparation, mass analysis hardware, or workflow and may be obtained on archived measured data acquired using mass analysers in the past. The invention is preferably partially implemented on a computer, especially the signal processing steps.

Further details of the means by which the invention provides these, and other, advantages are given in the description below.

In order to further understand the invention, embodiments will now be described in more detail with reference to the accompanying drawings. The embodiments described are examples and for illustration only and are not intended to, and do not, limit the scope of the invention.

BRIEF DESCRIPTION OF THE SEVERAL VIEWS OF THE DRAWINGS

FIG. 4A shows steps 2-50 of the algorithm; FIG. 4B shows steps 60-100 of the algorithm.

DETAILED DESCRIPTION OF THE INVENTION

Figure 1:
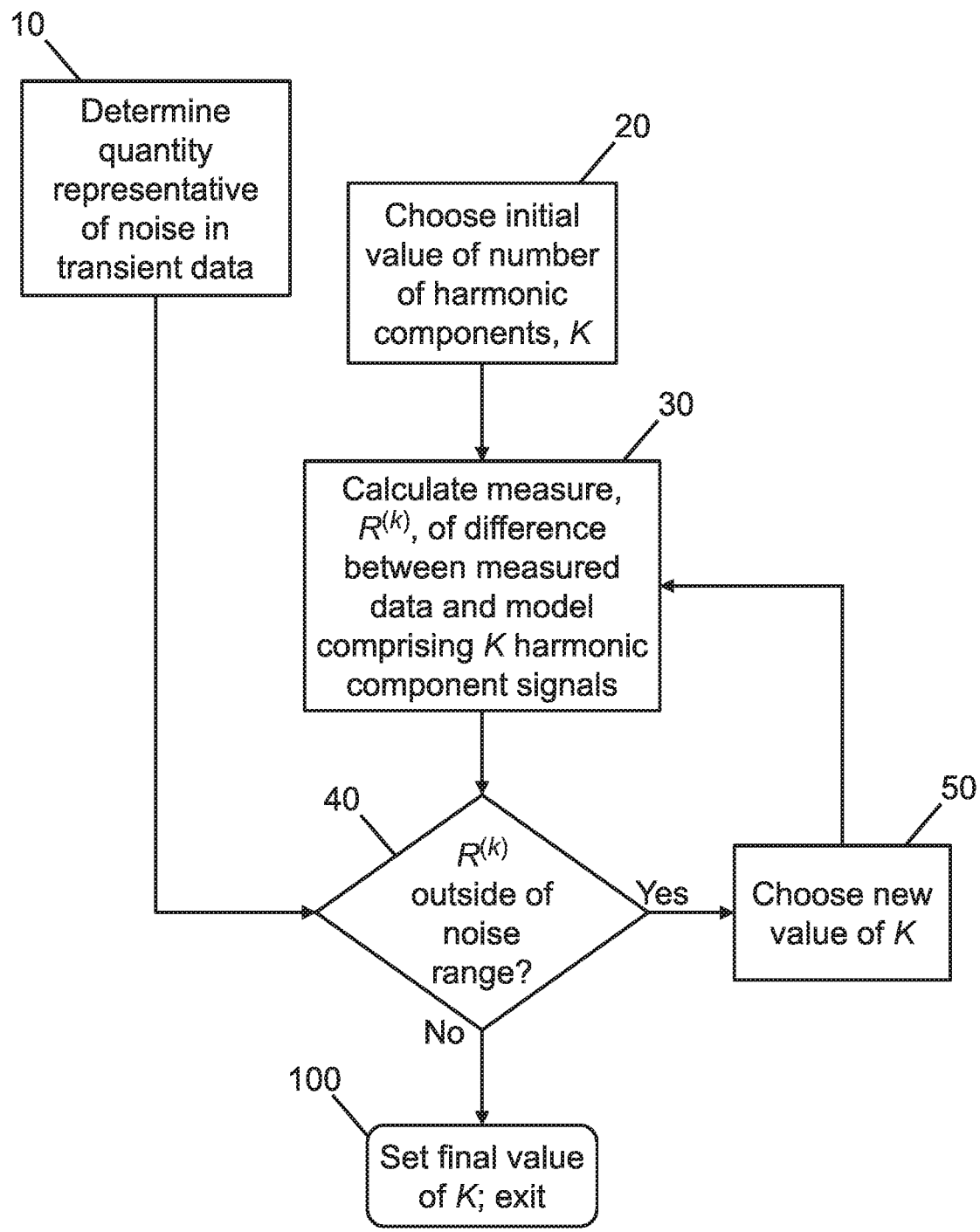
FIG. 1 shows a schematic block diagram depicting an example of the method of the present invention.

FIG. 1 shows a schematic block diagram depicting an example of the method of the present invention. In FIG. 1, a method is represented for determining harmonic component signals and their number, K, representative of different species of ions that are or were present within a mass analyser and within a range of mass-to-charge ratios, each species having a different mass-to-charge ratio. A quantity representative of the noise is determined, 10, which is representative of the noise in measured data comprising signal and noise which has been measured over time. An initial value of K is chosen, 20. A measure of difference $R^{(K)}$ between the measured data and model data comprising data sets of K-harmonic component signals is calculated 30. The measure of difference $R^{(K)}$ is compared to a noise range based upon the quantity representative of noise, 40, and if $R^{(K)}$ does not lie within the noise range, a new value of K is chosen, 50, and the measure of difference $R^{(K)}$ between the measured data and model data comprising data sets of K-harmonic component signals is again calculated, 30. When and if $R^{(K)}$ does lie within the noise range, K and the harmonic component signals have been determined, and the method terminates 100 in respect of finding K. Subsequent steps can then be performed as herein described, such as finding frequencies and amplitudes of the K harmonic signals and determining a mass spectrum. Where the method is performed using calculating apparatus, K and information about the harmonic component signals are output immediately prior to termination.

The measured data may have been measured immediately preceding the application of the method, or it may have been measured at any preceding time. The measured data may have been measured at the location at which the method is performed, or it may have been measured at some distant location. Consequently the method may be applied to data measured before the present invention had been made and it may be applied to data taken using a mass analyser at any remote location. Accordingly the method of the present invention does not necessarily include the step of measuring the measured data since the measured data may have been acquired earlier and/or elsewhere.

It will be appreciated that step 10, determining a quantity representative of the noise, may be performed before or after step 20 (choosing an initial value of K), and before or after step 30 (calculating $R^{(K)}$).

Figure 2A:
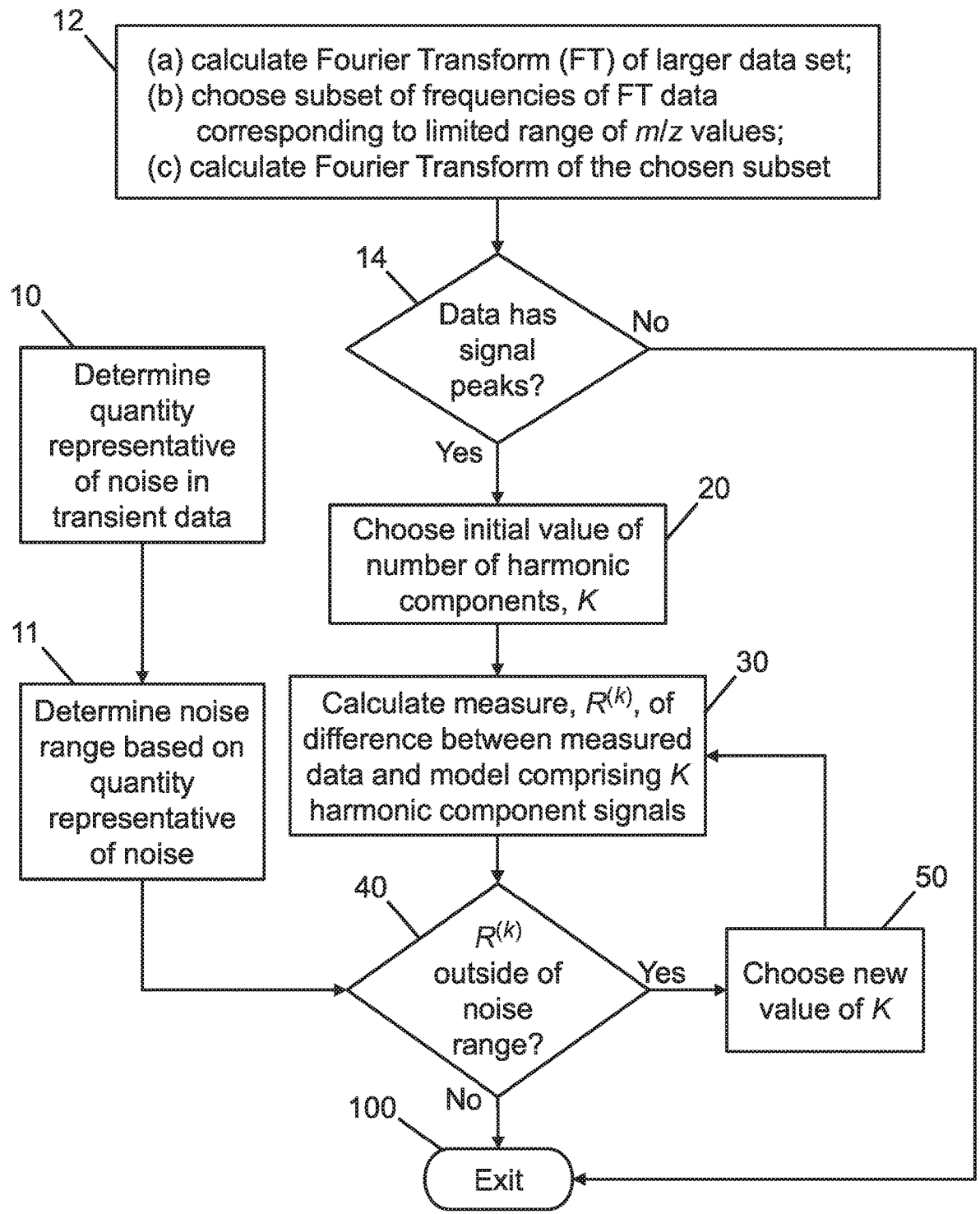
FIG. 2A shows a schematic block diagram depicting an example of the method of the present invention in further detail.

FIG. 2A is a schematic block diagram depicting an example of the method of the present invention in further detail. Similar steps to those depicted in FIG. 1 have the same identifiers.

The measured data comprises N data points $c_n$, where $c_n$ further comprises noise components $\delta_n$. $\delta_n$ represents additive noise with spectral noise power $v(f)=v_0$ over the frequency window corresponding to the range of mass-to-charge ratios, the RMS deviations of which are $\sqrt{\langle|\delta_n|^2\rangle}=\sigma_n=\sqrt{v_0 N/T}$. In this example the quantity representative of the noise is the noise power $\sigma^2$. The spectral noise power $v(f)=v_0$ is determined, 10 and the noise power $\sigma^2$ is determined from it; the additive noise components $\delta_n$ are unknown. Preferably in the methods of the present invention the spectral noise power is substantially constant, and in the present embodiment is assumed to be constant over the frequency window corresponding to the range of mass-to-charge ratios.

The quantity representative of the noise may be determined by one or more of: measuring the quantity representative of the noise from the measured data; measuring the quantity representative of the noise from a previous set of measured data derived from the mass analyser; measuring characteristics of preamplifiers used in the data measuring apparatus of the mass analyser; setting a quantity representative of the noise on the basis of prior knowledge of the mass analyser.

One preferred method of measuring the noise power from a previous set of measured data derived from the mass analyser comprises calculating the L2 norm of a calibration transient that is detected and digitized with no ions directed into the mass analyser.

A preferred method of measuring the quantity representative of the noise from the measured data itself, which may be performed on the frequency spectrum (i.e. after an FFT has been performed), comprises the steps of:

(a) calculating an average intensity of all the measured data;

(b) calculating the standard deviation of the intensity of all the measured data;

(c) calculating a first noise threshold on the basis of the average (avg) and standard deviation (sigma) calculated, preferably as avg+0.3.sigma;

(d) selecting a first set of points from the measured data on the basis that they have lower intensities than the first noise threshold;

(e) calculating the average intensity of the first set of points (avg1);

(f) calculating the standard deviation of the intensity of the first set of points (sigma1);

(g) calculating a second noise threshold on the basis of the average (avg1) and standard deviation (sigma1) calculated, preferably as avg1+0.3.sigma1;

(h) selecting a second set of peaks from the measured data on the basis that they have lower intensities than the second noise threshold.

The second set of peaks comprise noise and having been thus separated from peaks which are considered to be signal, the quantity representative of noise may be calculated from the second set of peaks.

In this example, a noise range is determined, 11, based upon the quantity representative of the noise.

Steps 10 and 11, determining a quantity representative of the noise, and determining a noise range, may be performed at any stage prior to 40, the comparison between the measure of difference $R^{(K)}$ and the quantity representative of the noise.

The model data comprising data sets of noiseless K-harmonic component signals forms a total model data set $c^*_n$ $$c^*_n = \sum_{k=1}^{K} A_k \exp(2\pi i f_k t_n) \tag{1}$$

where $t_n = N^{-1} n\,T$ $n=0\ldots N-1$, such that $c_n = c^*_n + \delta_n$.

The number of harmonics K, complex value amplitudes $A_k$ and complex-value frequencies $f_k$ are to be determined, and may be obtained by methods of the present invention as will be further described. The sought amplitudes and frequencies are complex and include, therefore, phase and decay information correspondingly. The measured data is preferably recorded at substantially constant time periods, T/N.

Figure 2B:
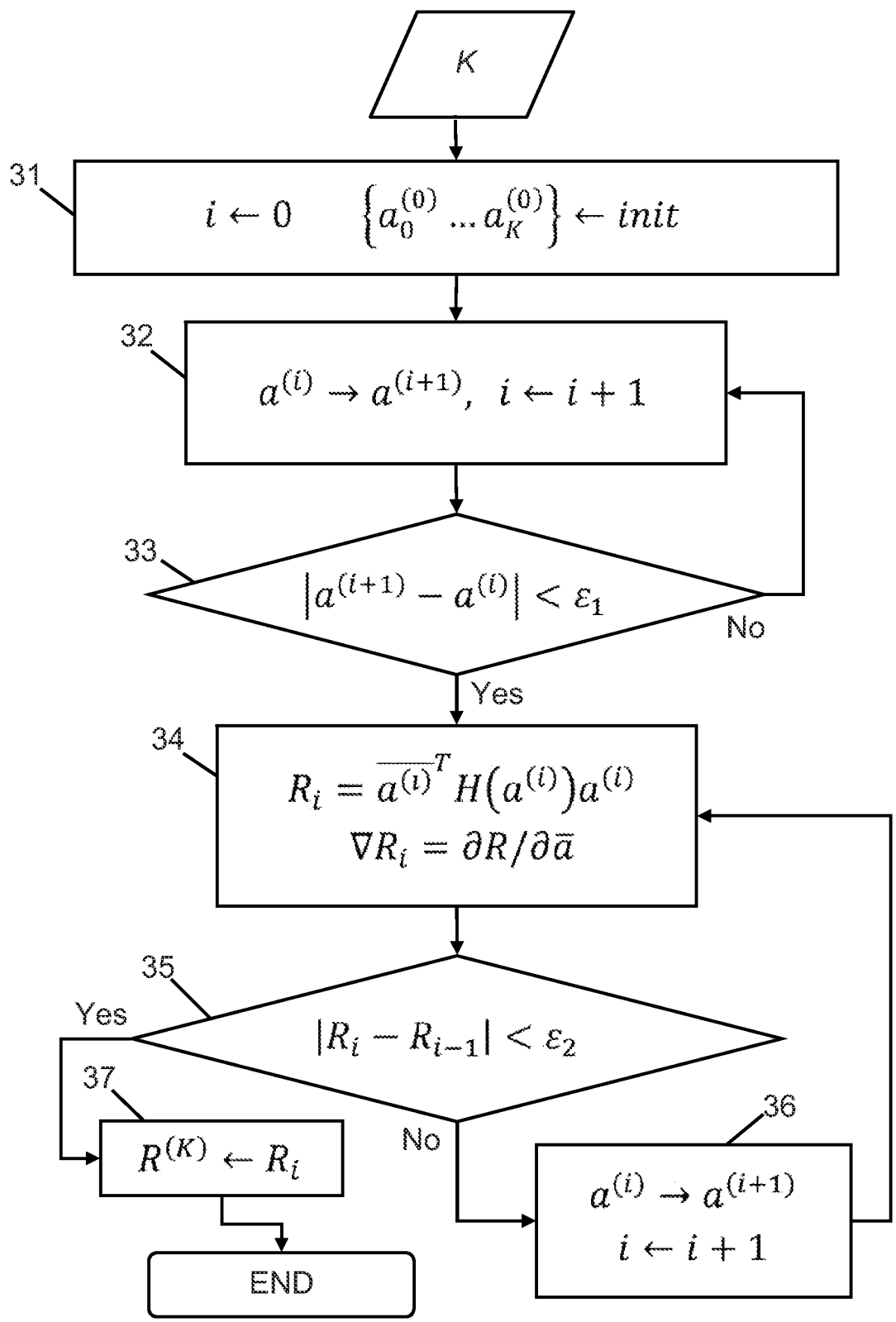
FIG. 2B shows in further detail a step in the method of the present invention, the step being the calculation of the minimum residual.

FIG. 2B describes in more detail the calculation of the minimum residual $R^{(K)}$, that is shown as position 30 in FIG. 1. A value for K is supplied and the initial values for the autocorrelation coefficients vector $\alpha$ are initialized with a normalized complex value K+1 dimensional vector 31. Iterations 32 in accordance with formulas $$a^{(i+\frac{1}{2})} = H(a^{(i)})^{-1}a^{(i)},$$

$$a^{(i+1)} = \left|a^{(i+\frac{1}{2})}\right|^{-1} a^{(i+\frac{1}{2})}$$

are performed a number of times until the difference of the autocorrelation coefficients on two subsequent iterations is smaller than a certain value of $\varepsilon_1$ 33. The value of residual $R_i$ and its gradient $\nabla R_i$ are then calculated 34, and the residual values on two subsequent iterations are compared 35. The quasi-Newton iterations 36 are performed in accordance with the formulas $$a^{(i+\frac{1}{2})} = a^{(i)} - H(a^{(i)})^{-1}\nabla R_i,$$

$$a^{(i+1)} = \left|a^{(i+\frac{1}{2})}\right|^{-1} a^{(i+\frac{1}{2})}$$

until the minimum of $R^{(K)}$ is approached with a certain accuracy $\varepsilon_2$. The value of $R^{(K)}$ is assumed equal to the residual norm on the last iteration 37.

Figure 3:
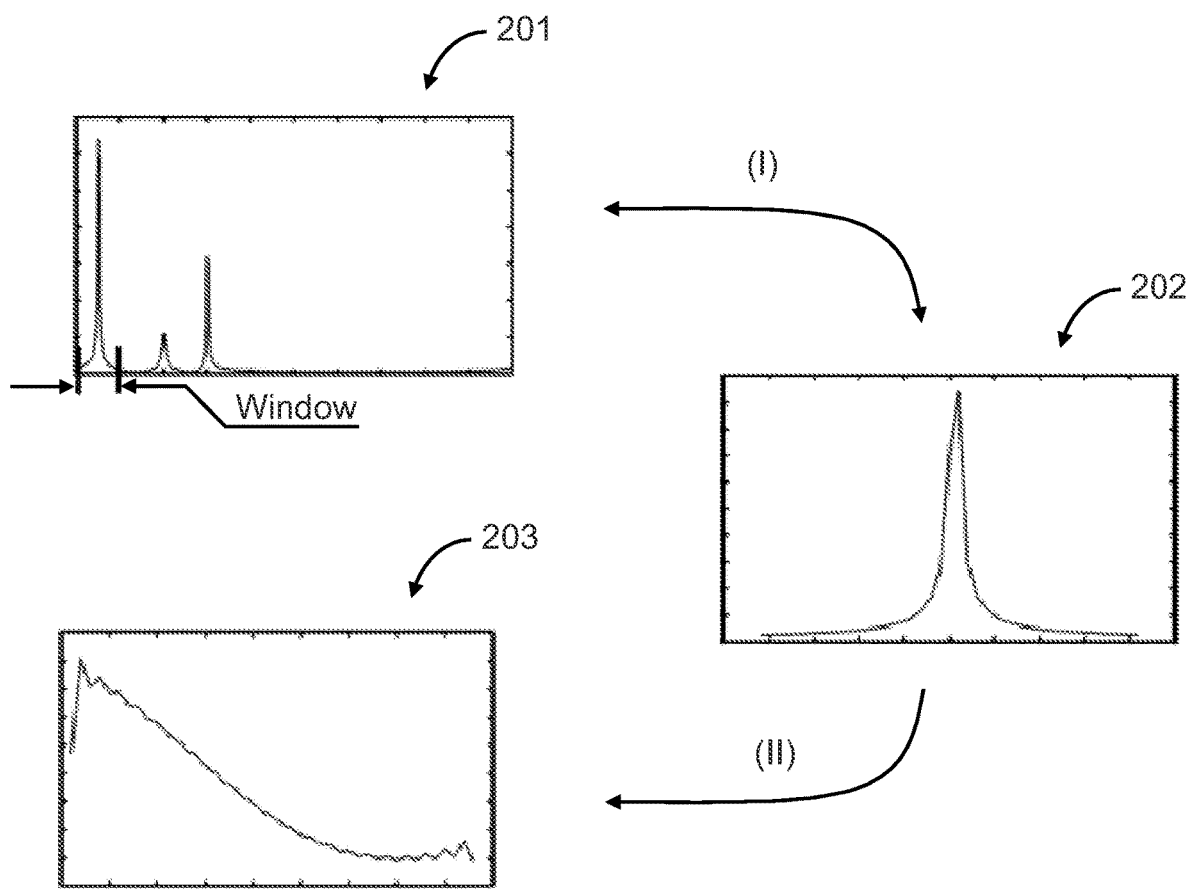
FIG. 3 shows a schematic representation of part of a process of selecting a frequency window of interest from the Fourier transform of the measured data and performing an inverse FT.

It may be convenient to perform the methods of the present invention using measured data comprising data relating to a limited range of mass-to-charge ratios in order to reduce computational complexity, and in order to ensure that the spectral noise power is substantially constant over the range of mass-to-charge ratios. Therefore optionally, the range of mass-to-charge ratios may be limited and selected from a larger data set. Preferably the range of mass-to-charge ratios is limited and is selected from a larger data set by a method comprising: obtaining a frequency spectrum of the larger measured data set to form a transformed data set, by for example, taking a Fourier transform of the larger measured data set; selecting a range of frequencies in the frequency domain spectrum of the transformed data set to form a transformed data subset, and; transforming the transformed data subset back into the time domain to form the measured data. A schematic representation of an example of part of this process is shown in FIG. 3. Step (I) consists of selecting a frequency window of interest from the Fourier transform of the larger measured data spectrum 201, and shifting the frequency window of interest by a negative offset, so that it is centered around zero within Nyquist frequency band to produce spectrum 202. Step (II) involves creating an inverse Fourier transform image of spectrum 202 to obtain the windowed measured data 203. This process is depicted at step 12 in FIG. 2A. Where the methods of the present invention are performed using measured data comprising a limited range of mass-to-charge ratios, preferably a relatively narrow spectral window $F_s \in \mathcal{E}$, ($s=s_0 \ldots s_0+N-1$) is taken from a fast Fourier transformation (FFT) of FTMS measured data $F \supset F_s$ that contains N Fourier transform bins. The reversed Fourier image in the time domain is:

$$c_n = \frac{1}{N}\sum_{s=s_0}^{s_0+N-1} F_s \exp\left[2\pi i\left(s - s_0 - \frac{N}{2}\right)\frac{t_n}{T}\right], \quad (2)$$

$$t_n = \frac{nT}{N}$$

$$n = 0 \ldots N - 1$$

The frequency content of which is limited to the measured frequencies $f \in [s_0/T \ldots (s_0+N)/T]$, which are shifted by a constant negative offset $\Delta f = -(s_0+N/2)/T$ to fit the Nyquist frequency band $f = f + \Delta f \in [-N/2T \ldots N/2T]$.

The following detailed example of the methods of the present invention will utilize this optional 'windowed' data set, i.e. the measured data comprises a range of mass-to-charge ratios which has been limited and selected from a larger data set. It will be appreciated that whilst this option has been chosen in order to give an example in which a limited data set has been chosen from a larger data set, the principles that follow apply equally if the whole data set had been utilized, as long as the spectral power of the noise remains substantially constant over the data set used.

Accordingly, the windowed measured data $c_n$ is assumed to be the K-harmonic data set $c^*_n$ corrupted by white Gaussian noise $\delta_n$: $c_n = c^*_n + \delta_n$, where $$c_n^* = \sum_{k=1}^{K} A_k \exp(i\Omega_k t_n)\delta_n \in \mathbb{C} A_k \in \mathbb{C} \quad (3)$$

$$\Omega_k = \Omega'_k + i\Omega''_k \in \mathbb{C}$$

with complex amplitudes $A_k$ and frequencies $\Omega_k$. The real parts of the frequencies are restricted within the band $-\pi N/T < \Omega'_k \leq \pi N/T$ thus eliminating the Nyquist uncertainty. (The space of K-harmonic signals is further denoted as $\mathbb{S}^K$.)

Optionally, a step 14 in FIG. 2, may be performed to determine whether the measured data, which may be windowed measured data, contains any signal peaks. If it does not contain peaks, then there is no need to determine the harmonic component signals and their number K. If it contains peaks, then the method can be performed to find the harmonic component signals and their number K. Determining whether peaks are contained in a spectrum is a known technique and such techniques may be employed here, e.g. determining whether peaks are contained by finding peaks which exceed a threshold level of intensity, or by other "peak picking" routines. Whether peaks are contained is preferably determined by calculating a norm: $\|c_n\| = N^{-1}\sigma^{-2}\Sigma|c_n|^2$, and, if the norm is less than 1, taking this to indicate that there are no peaks within the measured data which are above the noise, in which case the procedure terminates, 100. The method may then move to the next window of measured data and begin the procedure again.

A measure of difference $R^{(K)}$ between the measured data and model data comprising data sets of K-harmonic component signals may be represented as:

$$R^{(K)} = \min\|\delta_n\| \quad (4)$$

$$= \min \frac{1}{N} \sum_{n=0}^{N-1} |\delta_n|^2$$

$$= \min \frac{1}{N} \sum_{n=0}^{N-1} |c_n - c_n^*|^2, (c_n^*) \in \mathbb{S}^k$$

where K is the number of K-harmonic signals in the model data set, and K is the measure of how many different species of ions are or were present within a mass analyser when the measured data was acquired and within a range of mass-to-charge ratios, each species having a different mass-to-charge ratio. Other forms of difference $R^{(K)}$ may be used but preferably the form of equation (4) is used and will be used in this example, being a minimised normalized sum of residuals between the measured data and the model data at a plurality of data points. The measure of difference $R^{(K)}$ is preferably minimised, i.e. is the minimum value, for each given value of K as described in more detail below. In other words, for each K, $R^{(K)}$ is determined as the minimum norm of the difference between the signal $c_n$ and any possible K-harmonic signal $c^*_n$.

Accurate estimation of the number of mass peaks plays a vital role in the performance of this or any other method operating under noisy conditions typically found in FTMS data. Since the number of harmonics cannot be determined exactly for noisy measured data this method evaluates the statistically most probable value of K. On increasing K, $R^{(K)}$ tends to zero, as more and more harmonic signals are added to the model data set and the model data set may more closely match the measured data. Indeed when K=N the model data set can equal the measured data—including the noise components within the measured data, i.e. such that the difference $R^{(K)}=0$ when K=N. It may be shown that when K=N/2 a combination of K-harmonic signals may also be made to equal the measured data, as in the prior art FDM. However unlike prior art methods, in the present invention K is restricted so that the K-harmonic model data set does not model significantly more than the signal component of the measured data, and in this way it distinguishes signal from noise. Methods of the invention use an initial value of K to calculate a value for $R^{(K)}$ and this value is compared to a noise range based upon the determined quantity representative of the noise. If $R^{(K)}$ does not lie within the noise range, the value of K is changed and $R^{(K)}$ recalculated. This process is repeated as many times as necessary until $R^{(K)}$ does lie within the noise range, thereby finding the most probable value of K and the harmonic component signals. This process ensures that the K-harmonic data set thus formed will substantially only model the signal component of the measured data.

Hence an initial value for K is chosen, 20 in FIG. 2A, and the measure of difference $R^{(K)}$ is calculated, 30. The value $R^{(K)}$ is compared to the noise range which is based upon the determined quantity representative of the noise, preferably the noise power, 40. If $R^{(K)}$ does not lie within the noise range, the value of K is changed, 50, and $R^{(K)}$ recalculated, 30. This process is repeated as many times as necessary until $R^{(K)}$ does lie within the noise range. K and the harmonic component signals are thereby determined when that condition is met.

If the information within the measured data set is previously unprocessed, it is computationally efficient to start the process with an initial value for K of zero, and increase K from that value, as the data from mass analysers when operating at high resolving power is sparse. Alternatively, if the measured data is first processed, an initial value for K may be determined from a number of peaks in the frequency domain spectrum of the measured data. If the measured data is first processed by, for example, taking a Fourier transform of the measured data, then an initial value for K may be determined from a number of peaks in the frequency domain spectrum of the transformed data thus found. It will be appreciated that K may, alternatively, be decreased from an initial value (where the initial value is greater than zero). K may be decreased from an initial value which is less than N/4 as K will usually be very much smaller than N in the method of the present invention, because of the sparse nature of the data from mass analysers operating at high resolving powers, and, significantly, because the method of the invention does not seek to fit harmonics to noise, and then subsequently distinguish noise results from valid ion signals as is a feature of some prior art methods. Rather the method seeks to fit just enough K-harmonic signals to the data so as to avoid the noise and this approach thereby preferably finds just enough K-harmonics as there are ion species within the range of mass-to-charge ratios in the sample of measured data.

Accordingly the value of K is changed and $R^{(K)}$ is recalculated, preferably until $R^{(K)}$ falls within the noise range; and/or until $R^{(K)}$ is just less than, or is equal to, the quantity representative of the noise; and/or until $R^{(K)}$ becomes the closest value to the quantity representative of the noise. In practice this can be achieved simply by determining K as the minimum value for which the measure of difference $R^{(K)}$ equals or preferably becomes less than the quantity representative of the noise, which typically means just less than the quantity representative of the noise.

Direct numerical evaluation of equation (4) with respect to complex frequencies and amplitudes $A_k$, $\Omega_k$ is an essentially nonlinear problem which has no robust solution, given non-convexity of the norm and large number of local minima resulted from the oscillating nature of the fitting function equation (3). However, methods of the present invention preferably utilize the property that the signal component of the measured data (i.e. not including the noise) possesses autocorrelative properties, which means that each successive value of intensity in the signal component of a measured data set (such as a transient) can formally be represented as a linear combination of the signal component of the measured data at previous time-points. Accordingly the K-harmonic signal may be written:

$$c^*_n = \alpha_0 c^*_{n-K} + \alpha_1 c^*_{n-K+1} + \ldots \alpha_{K-1} c^*_{n-1} \quad (5)$$

where $\alpha_0, \ldots \alpha_{K-1}$ are autocorrelation coefficients.

It will be appreciated that the autocorrelative properties also mean that a preceding value of intensity in a measured data set can also formally be represented as a linear combination of the measured data at succeeding time-points, and a similar equation could be written to express that without departing from the present invention. In this example, equation (5) will be used.

Preferably the model data set comprises an harmonic signal which may be described by a sum of K complex exponential terms each multiplied by complex amplitudes, such as is set out in equations (1) and (3), and the K harmonic signals are derived assuming the harmonic signal possesses autocorrelative properties as described by equation (5).

As mentioned, the method of the invention effectively involves a form of estimating probabilities for different numbers K of individual harmonics with non-zero amplitudes in the model data set and finds the most probable number. Both real and imaginary parts of $\delta_n$ are taken to be independent complex values, normally distributed with mean-square deviations $\sigma/\sqrt{2}$. Therefore $R=\|c_n-c^*_n\|=\|\delta_n\|$ is statistically distributed as $\chi^2$ with 2N degrees of freedom, having the probability density function $$p(R) = \frac{N^{N+1}}{N!\sigma^{2N}} R^{N-1} \exp\left(-\frac{NR}{\sigma^2}\right), R \geq 0 \qquad (6)$$

and a corresponding cumulative probability can be expressed through the incomplete Euler gamma function as $$P(R) = \int_R^\infty p(R')dR' = \frac{\Gamma(N, NR/\sigma^2)}{(N-1)!} \qquad (7)$$

The value $P(R^{(K)})$ gives the probability for the number of harmonics in the noise-free model data $\{c^*_n\}$ to assume a value less than or equal to K. The probability for the number of harmonics to take value K exactly is $p_k=P(R^{(K)})-P(R^{(K-1)})$. The most probable value of K that provides the highest fidelity approximation of the actual number of harmonics in the signal, corresponds to the maximum of the distribution (6) $R^*=(1-1/N)\sigma^2 \approx \sigma^2$ lying between $R^{(K)}$ and $R^{(K-1)}$. As already described, a practical way to estimate the most probable K consists in repeatedly increasing the values of K starting from an initial value (preferably zero) until the residual norm $R^{(K)}$ drops below $R^* \approx \sigma^2$. In an alternative embodiment, involving the try value of K repeatedly decreasing, the method is stopped (K−1 is found and therefore K is found) when $R^{<K-1>}$ just exceeds the quantity representative of the noise $\sigma^2$. Considering both cases (increasing or decreasing K), the stop condition can be formulated as the double inequality: $R^{(K)} \leq \sigma^2 < R^{(K-1)}$.

Calculation of $R^{(K)}$ is performed as the numerical minimization of the residual norm with respect to 2K complex-value parameters of the sought noise-free model data $\{c^*_n\}$—the frequencies $\Omega_k$ and amplitudes $A_k$. Since any K+1 subsets $\Gamma_p=(c^*_p, \ldots, c^*_{p+K})$ of K+1 subsequent elements are not linearly independent and the matrix with rows $\Gamma_0 \ldots \Gamma_K$ is degenerate, there exists a non-zero complex-value vector $a=(a_0 \ldots a_K)$, which is referred to as the set of autocorrelation coefficients for the signal $c^*_n$, such that $$a_0 c^*_n + a_1 c^*_{n+1} + \ldots + a_K c^*_{n+K} = 0 \quad \forall n \in 0 \ldots N-K-1 \qquad (8)$$

i.e. it is possible to associate any K-harmonic signal with a set of K+1 complex autocorrelation coefficients $a_0, \ldots, a_K$ with the use of N−K linear conditions. The coefficients $a_k$ are, for the purpose of computational feasibility, normalized as $\Sigma|a_k|^2=1$.

Preferably, equation (8) is a strict condition imposed on the initially unknown noiseless model data set $c^*_n$ as proposed in Osborne, M. R. and Smyth, G. K. (1991). A modified Prony algorithm for fitting functions defined by difference equations. *SIAM Journal of Scientific and Statistical Computing*, 12, 362-382. The formulae (8) are then treated as extra conditions to be satisfied in the minimization procedure for residual norm of equation (4). Methods of the present invention preferably find a set of autocorrelation coefficients $a_0, \ldots, a_K$ that define the K-harmonic signal being nearest to $c_n$ in the sense of the residual norm of equation (4), under N−K conditions imposed on $c^*_n$. In matrix form these conditions read:

$$\aleph \begin{pmatrix} c^*_0 \\ c^*_1 \\ \ldots \\ c^*_{N-1} \end{pmatrix} = 0, \qquad (9)$$

$$\aleph = \begin{bmatrix} a_0 & a_1 & \cdots & a_K & 0 & 0 & 0 \\ 0 & a_0 & a_1 & \cdots & a_K & 0 & 0 \\ \cdots & \cdots & \cdots & \cdots & \cdots & \cdots & \cdots \\ 0 & 0 & 0 & a_0 & a_1 & \cdots & a_K \end{bmatrix}$$

where $\aleph$ is (K+1)-diagonal rectangular (N−K)×N Toeplitz matrix. The Lagrange method is preferably used to express the minimal residual norm for the difference between the windowed measured data $c_n$ and any K-harmonic signal which satisfies the conditions (8) with given autocorrelation coefficients. Therefore, the norm in matrix notation becomes $$R(a) = N^{-1} \overline{\delta}^T \Sigma^{-1} \delta = N^{-1} \overline{a}^T H(a) a \qquad (10)$$

where $H(a) = \overline{C}^T B(a)^{-1} C$, $B(a) = \aleph(a)\Sigma\aleph\overline{(a)}^T$, and C is a shifted measured data matrix $$C = \begin{bmatrix} c_0 & c_1 & \cdots & c_K \\ c_1 & c_2 & \cdots & c_{K+1} \\ \vdots & \vdots & & \vdots \\ c_{N-K-1} & c_{N-K} & \cdots & c_{N-1} \end{bmatrix} \qquad (12)$$

Although minimization of R(a) with respect to a is a nonlinear problem, it is robust and practically realizable for arbitrary initial values of a.

The problem of finding a minimal residual norm with respect to any possible K-harmonic signal is thus reduced to minimization of (10) with respect to all possible normalized sets of $a_k$, that is $R^{(K)} = \min R(a)$. The matrix H(a) is parametrically dependent on $a_k$, which makes the said minimization problem nonlinear; nevertheless the function R(a) is smooth and generally has only one local minimum which represents the global minimum (its degeneracy with respect to the common phase of $a_k$ is not critical). Any known iterative method of numerical minimization to find $R^{(K)}$ and the minimizing set of $a_k$, e.g. the method of gradient decent, or the method of conjugated gradients, gives a robust algorithm which is practically independent on the choice of initial values.

Preferably, therefore, a method of harmonic inversion is used to find the set of autocorrelation coefficients. By this process, the most probable value for K is found, where the most probably value is taken to be when $R^{(K)}$ becomes substantially equal to the quantity representative of the noise.

Having determined the harmonic component signals and their number K, and in doing so, determined the autocorrelation coefficients (the complex-value vector $a=(a_0 \ldots a_K)$), the frequencies of the K-harmonic signals are determined by finding the roots of the K-order polynomial equation $$a_0 + a_1\lambda + a_2\lambda^2 \ldots + a_K\lambda^K = 0 \qquad (13)$$

The set of autocorrelation coefficients unambiguously defines the set of frequencies $\Omega_K$ in the windowed measured data and corresponding real-value frequencies $f_k$ in the larger data set with formulas $$\Omega_k = -i\frac{N}{T}\ln\lambda_k, \tag{14}$$

$$f_k = \frac{s_0 + N/2}{T} + \frac{\text{Im}\Omega_k}{2\pi}$$

The fact that the signal is K-harmonic and cannot be reduced to a (K−1) harmonics with autocorrelation coefficients $a_0$ and $a_K$ non-zero and all frequencies $\Omega_k$ unique within the Nyquist band, ensures that all roots $\lambda_k$ are non-zero and unique.

If the harmonic signals are non-decaying, a particular case occurs. By setting additional constraints $a_{K-k}/a_k=1$, the following parameterization $$a_t = \frac{b_t + ib_{K-t}}{\sqrt{2}}, \tag{15}$$

$$a_{K-t} = \frac{b_t - ib_{K-t}}{\sqrt{2}},$$

$$a_{K/2} = b_{K/2}$$

where index t runs in the range $0 \leq t < K/2$ and $(b_0, \ldots, b_K)$ is real-value vector that obeys the normalization condition $|b|^2 = \sum_{k=0}^{K} b_k^2 = 1$ allows (10) to be rearticulated as $$R^{(K)}(b) = N^{-1}b^T H(b)b, \; H(b) = \text{Re}\{\overline{C'^T}[\aleph(a(b))\Sigma\aleph\overline{(a(b))^T}]^{-1}C'\} \tag{16}$$

where elements of the $(N-K) \times (K+1)$ matrix $C'$ are $$C'_{p,t} = \frac{C_{p+c} + C_{p+K-t}}{\sqrt{2}}, \tag{17}$$

$$C'_{p,K-t} = i\frac{C_{p+c} - C_{p+K-t}}{\sqrt{2}},$$

$$C'_{p,K/2} = C_{p+K/2}$$

with $0 \leq t < K/2$ (the last formula is only for even K).

The amplitudes are found by minimization of the original norm of the residual expressed as $R = (1/N)\sum_n |c_n - \sum_k A_k (\lambda_k)^n|^2$. Having determined K and $\lambda_k$, the noise-free signal can be reconstructed as $$c^* = \begin{pmatrix} c_0^* \\ \cdots \\ c_{N-1}^* \end{pmatrix} \tag{18}$$

$$= \Lambda A^*,$$

$$\Lambda = \begin{bmatrix} 1 & 1 & \cdots & 1 \\ \lambda_0 & \lambda_1 & \cdots & \lambda_{K-1} \\ \lambda_0^2 & \lambda_1^2 & \cdots & \lambda_{K-1}^2 \\ \cdots & \cdots & \cdots & \cdots \\ \lambda_0^{N-1} & \lambda_1^{N-1} & \cdots & \lambda_{K-1}^{N-1} \end{bmatrix}$$

where $A^*$ is the vector of amplitudes. $A^*$ is determined by minimizing the norm of residual (4):

$$R = \|c_n - c_n^*\| \tag{19}$$

$$= \overline{A}^T M A - \overline{A}^T G - \overline{G}^T A + \|c_n\|$$

where $$M = \frac{1}{N}\overline{\Lambda}^T \Lambda, \tag{20}$$

$$G = \frac{1}{N}\overline{\Lambda}^T \begin{pmatrix} \overline{c_0} \\ \cdots \\ \overline{c_{N-1}} \end{pmatrix}$$

This set of amplitudes that delivers the minimum to (19) appears as a solution to the system of linear equations $\partial R/\partial \overline{A} = MA - G = 0$ $$A^* = M^{-1}G, \; R(A^*) = R^{(K)} = \|c_n\| - \overline{G}^T M^{-1} G \tag{21}$$

Fixating the phase is achieved by introducing an additional constraint to the amplitudes $A = B^* e^{i\psi}$ where $B \in \text{Re}$ and $\psi$ is the common phase.

The method also allows for statistical assessment of the determined values for the amplitudes and frequencies, which provides qualitatively better data for further analysis of the mass spectrum. Reporting fidelity criteria for detected mass-to-charge peaks (such as confidence intervals for mass-to-charge ratios and abundances) significantly increases both specificity and selectivity of the informatics approaches that rely on mass spectra as an input.

In a similar way to the evaluation of the number of harmonics in windowed measured data, the residual of the norm is treated as a random variable which parametrically depends on deviations. Any deviation $\Delta A_k$ of the amplitude from its most probable values $A^*_k$ necessarily increases the residual norm by the value $\Delta R \sim r_k |\Delta A_k|^2 > 0$; and any deviation $\Delta f_k$ of the frequency from its most probable values $f^*_k$ necessarily increases the residual norm by the value $\Delta R \sim q_k |\Delta f_k|^2 > 0$.

The conditional cumulative probability function (under the condition that the number of harmonics is exactly K) is $$P^{(K)}(\Delta R) = \frac{\Gamma(N, N(R^{(K)} + \Delta R)/\sigma^2)}{\Gamma(N, NR^{(K)}/\sigma^2)} \tag{22}$$

$$\approx 1 - \text{erf}\left(\sqrt{\frac{N}{2}}\frac{\Delta R}{\sigma^2}\right), \; N \gg 1$$

and gives the probability that R exceeds $R^{(K)}$ by the value greater than $\Delta R$. Correspondingly, the probability that $\Delta R > 1.96 \; \sigma^2/\sqrt{N}$ appears less than 0.05. The confidence intervals in which the harmonic's amplitude or frequency are found with the 95% fidelity are estimated as $$|\Delta A_K| \leq \frac{\sigma}{N^{1/4}}\sqrt{\frac{1.96}{r_k}} \tag{23}$$

and $$|\Delta f_K| \leq \frac{\sigma}{N^{1/4}}\sqrt{\frac{1.96}{q_k}}$$

correspondingly. The coefficients $r_k$ and $q_k$ are found either analytically or numerically.

Figure 4A:
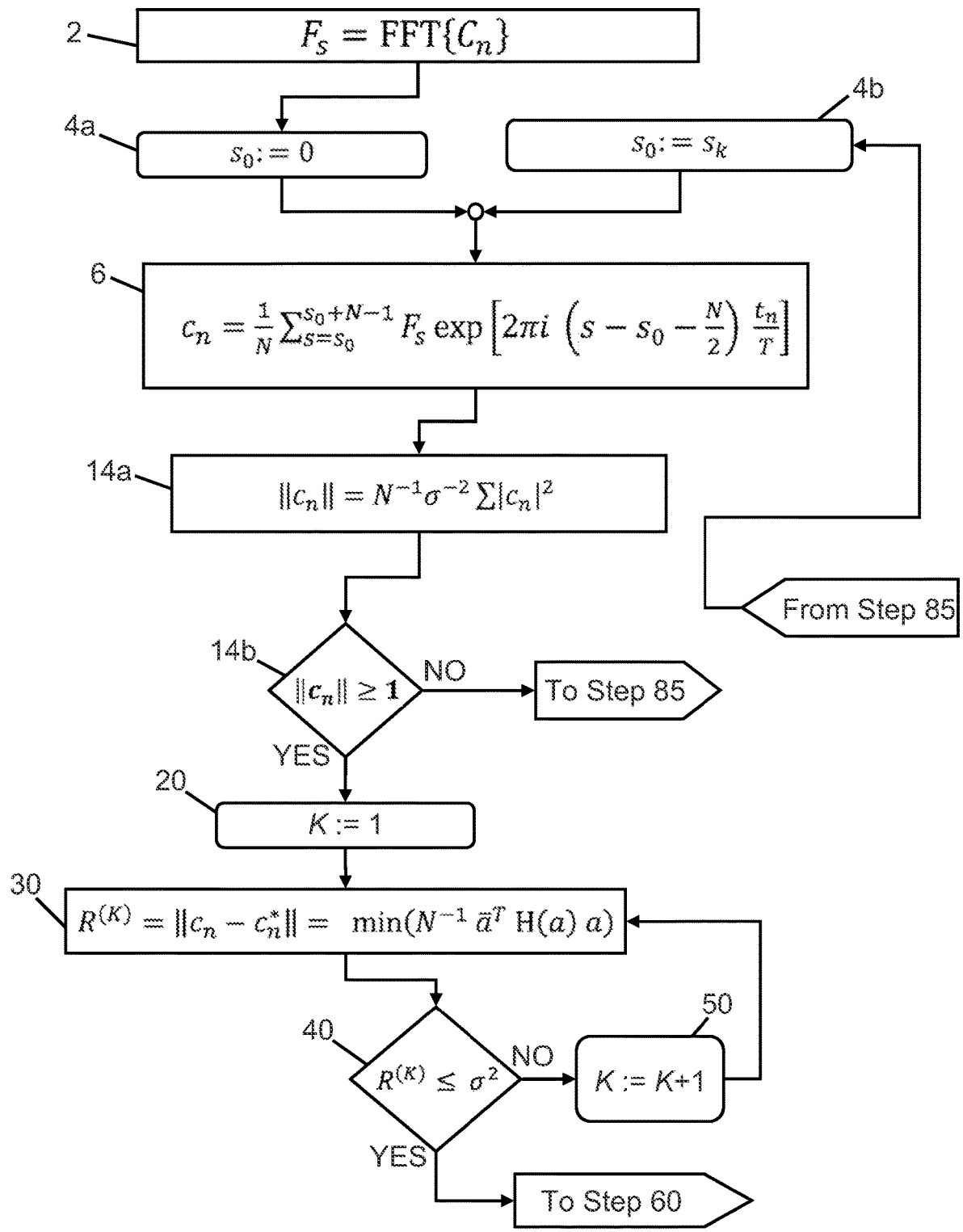
FIGS. 4A and 4B show a schematic block diagram depicting a workflow of an algorithm for performing the invention.
Figure 4B:
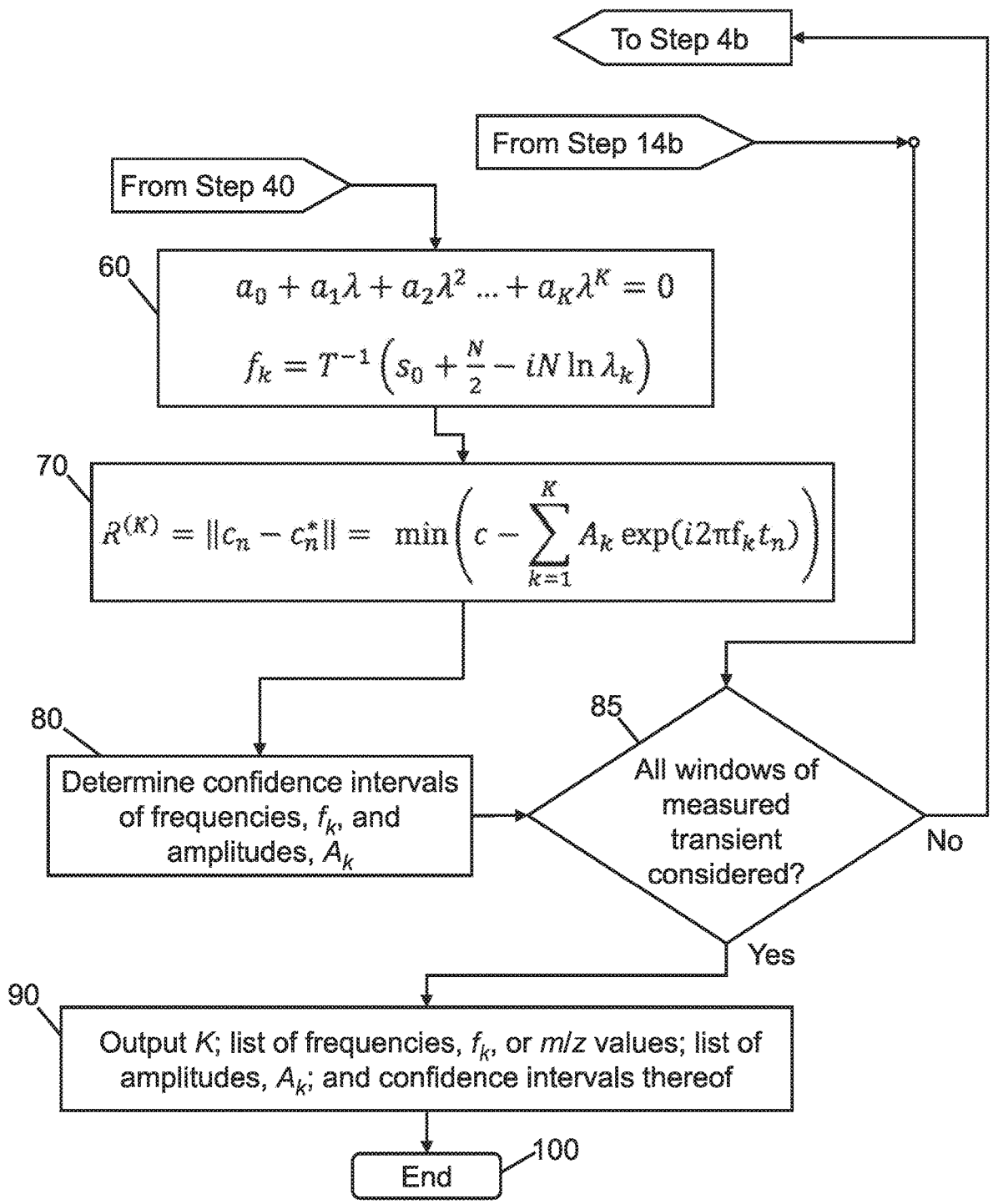

In view of the above description, embodiments of the invention may be performed according to the schematic block diagram depicted in FIG. 4, which shows a workflow of an algorithm for performing the invention. FIG. 4A shows steps 2-50 of the algorithm and FIG. 4B shows steps 60-100 of the same algorithm. A FFT is taken of transient measured data, 2. A first window is selected 4*a*, and $s_0=0$, the window being selected from the first N points of the Fourier transformed data.

Windowed transient measured data $$c_n = \frac{1}{N} \sum_{s=s_0}^{s_0+N-1} F_s \exp\left[2\pi i\left(s-s_0-\frac{N}{2}\right)\frac{t_n}{T}\right]$$

is then first compiled from the larger measured data set, 6. The norm $\|c_n\|=N^{-1}\sigma^{-2}\Sigma|c_n|^2$ is calculated 14*a*, and a decision is made 14*b*: if the norm is greater than or equal to 1, it is taken that peaks are present in the windowed measured data and the procedure continues to 20; if not, the procedure passes to step 85 which will be described below.

At step 20, a first value of K is selected which in the first iteration is, in this example, K:=1. The vector of autocorrelation coefficients $a_k$ is then calculated, 30, the values of $a_k$ being found which minimize the difference between the measured data and the model data set for the particular value of K, to give the measure of difference $R^{(K)}=\|c_n-c^*_n\|=\min(N^{-1}\bar{a}^T H(a)a)$. The measure of difference $R^{(K)}$ is then compared to the determined noise range, 40, and if the measure of difference $R^{(K)}$ lies within the noise range, the harmonic component signals and their number K, the measure of how many peaks are present in the windowed measured data, has been found, and the value of K is stored for future output, the procedure passing to step 60. If $R^{(K)}$ does not lie within the noise range, then a new value of K is selected, 50, in this case K:=K+1, and the new value of K is used in 30 to calculate a new value for $R^{(K)}$ and so on until the measure of difference $R^{(K)}$ does lie within the noise range and K has been found.

At 60, peak frequencies are found by solving the $K^{th}$-order polynomial $a_0+a_1\lambda+a_2\lambda^2\ldots+a_K\lambda^K=0$, giving frequencies in the larger measured data set $$f_k = T^{-1}\left(s_0+\frac{N}{2}-iN\ln\lambda_k\right).$$

The frequencies are stored for future output and the procedure passes to 70, whereupon the peak amplitudes $A_k$ are found to minimize the norm of the residual:

$$R^{(K)} = \|c_n - c_n^*\|$$
$$= \min\left(c - \sum_{k=1}^{K} A_k \exp(i2\pi f_k t_n)\right).$$

The amplitudes thus found are again stored for future output and the procedure passes to 80, finding the confidence intervals for the frequencies and amplitudes just obtained at 60 and 70. The confidence intervals are stored for future output, and the procedure passes to 85, where a decision is taken as to whether or not the windowed measured data just analysed, or partly analysed if the step is arrived at from 14*b*, was the last windowed measured data set from the larger measured data set. If not the procedure passes to 4*b*, at which the next windowed measured data is chosen, $s_0:=s_k$ and the procedure then passes to 6 once again.

Once all windowed measured data sets have been processed in the above way, the procedure passes to 90 whereupon the previously stored data comprising K, the list of frequencies, amplitudes and their confidence intervals is output, and the procedure terminates, 100. It will be appreciated that the output may be of various formats. For example, the frequencies are typically translated into mass-to-charge ratios and the amplitudes into ion abundances for output. The preferred output comprises a measure of the number of different species of ions, mass-to-charge ratios of ions together with their abundances and terms indicating confidences in those values, e.g. as a mass spectrum.

To further illustrate methods of the invention, synthetic test data of three sine waves together with added noise is analysed, and the results illustrated in FIGS. 5, 6, 7 and 8, at a succession of increasing noise powers, $\sigma^2$, to enable comparison of the methods as the signal to noise alters. For each noise power, 1000 different random noise signals of the given noise power are used and in each of the 1000 cases the methods are applied to produce determined values of K, and the frequencies and amplitudes for each found K. This approach shows how the method performs for different random noise contributions at each signal to noise ratio.

Figure 5A:
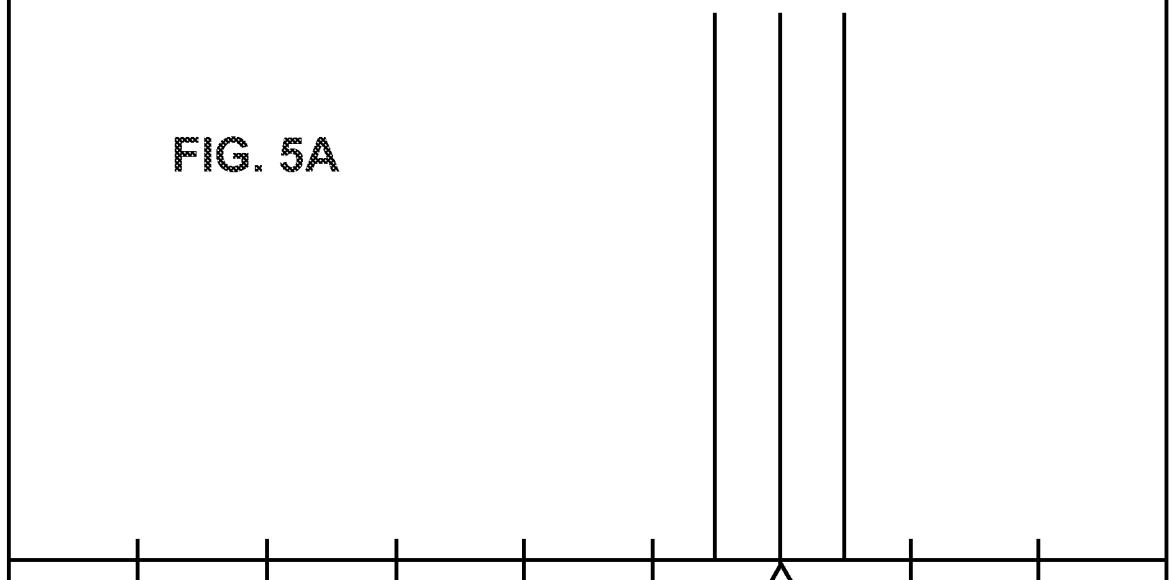
FIG. 5A shows a noiseless test signal that comprises synthetic test data of three sine waves plotted on an amplitude vs. frequency bin scale.
Figure 5B:
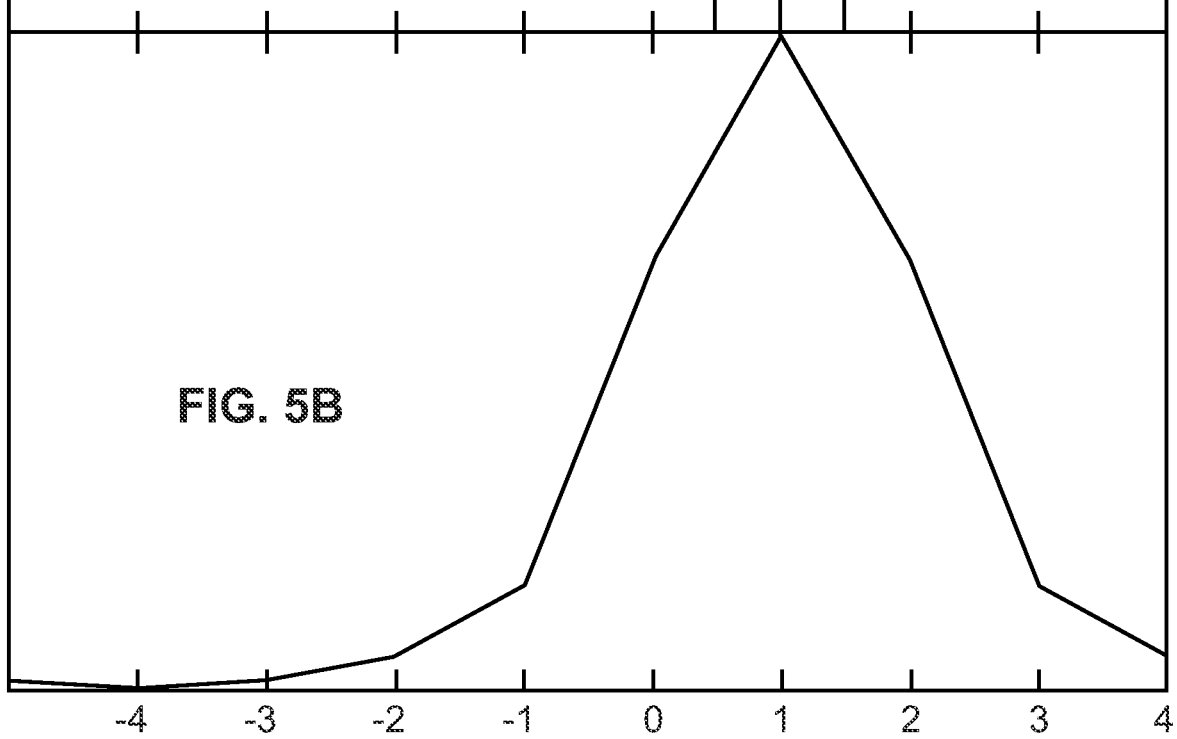
FIG. 5B shows the conventional FT power spectrum which would be generated for the three sine waves of FIG. 5A.

FIG. 5A shows the noiseless test signal plotted on an amplitude vs. frequency bin scale, which consists of three non-decaying harmonics separated by 0.5 FT bins each with amplitudes 1. FIG. 5B shows the conventional FT power spectrum which would be generated for the three sine waves which have differences in frequency below the Nyquist limit. The components are clearly not resolved in the FT spectrum.

Figure 6A:
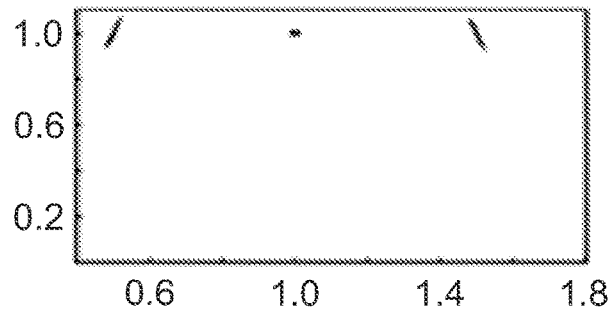
FIG. 6A is a plot of the resultant values calculated using the methods of the invention of amplitude vs. frequency on the test signal of FIG. 5A for 1000 different random noise cases each of which has noise $\sigma=0.001$.

FIG. 6A is a plot of the resultant values calculated using the methods of the invention of amplitude vs. frequency for the 1000 different random noise cases each of which has $\sigma=0.001$ (the lowest noise case). It can be seen that the method has distinguished three peaks, each having amplitudes close to 1.0, located at frequencies close to 0.5, 1.0 and 1.5, and though the figure cannot show this, for each of the 1000 cases three peaks were distinguished. The spread in the points plotted indicates the range of variation of the calculated amplitudes and frequencies due to the presence of the noise, slightly different values for amplitude and frequency being determined by the methods for different random noise cases, though all noise distributions had the same RMS noise deviations such that $\sigma=0.001$. FIG. 6B again shows the FT power spectrum of the noise-free signal together with error bars indicating the uncertainty which would be produced by the noise (hardly discernible).

Figure 6B:
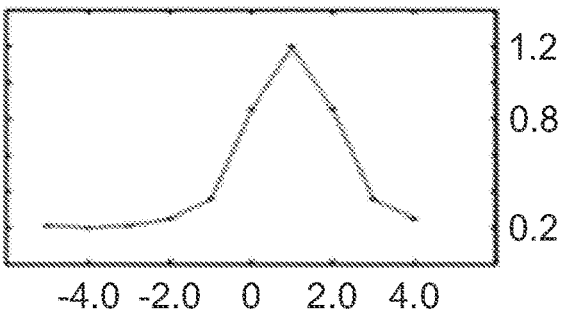
FIG. 6B shows the FT power spectrum of the noise-free signal together with error bars indicating the uncertainty which would be produced by the noise.
Figure 7A:
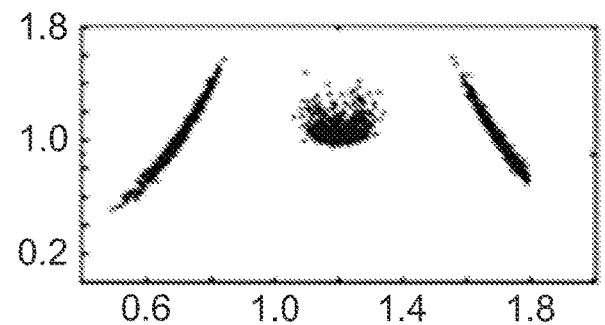
FIG. 7A is a similar plot to that of FIG. 6A but with RMS noise deviations such that $\sigma=0.01$.
Figure 7B:
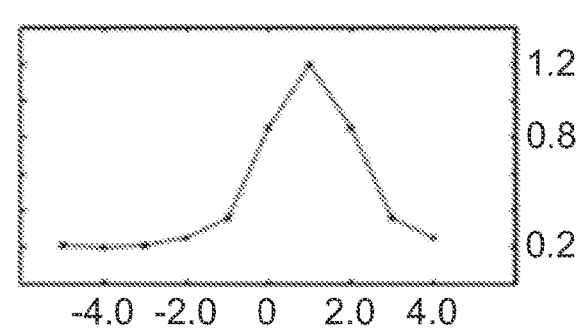
FIG. 7B is a similar plot to that of FIG. 6B but with RMS noise deviations such that $\sigma=0.01$.
Figure 8A:
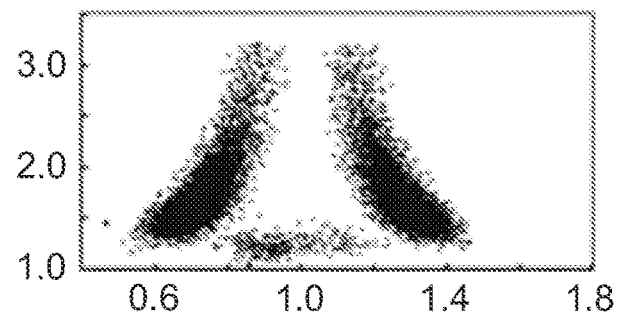
FIG. 8A is a similar plot to that of FIG. 6A but with RMS noise deviations such that $\sigma=0.1$.
Figure 8B:
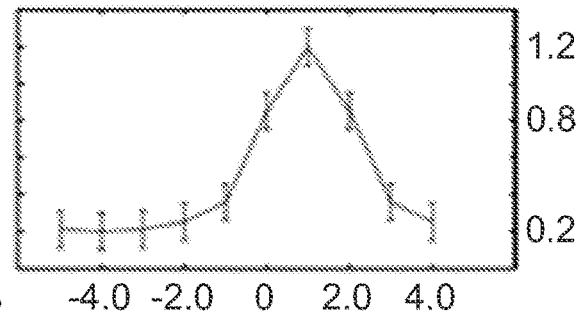
FIG. 8B is a similar plot to that of FIG. 6B but with RMS noise deviations such that $\sigma=0.1$.
Figure 9A:
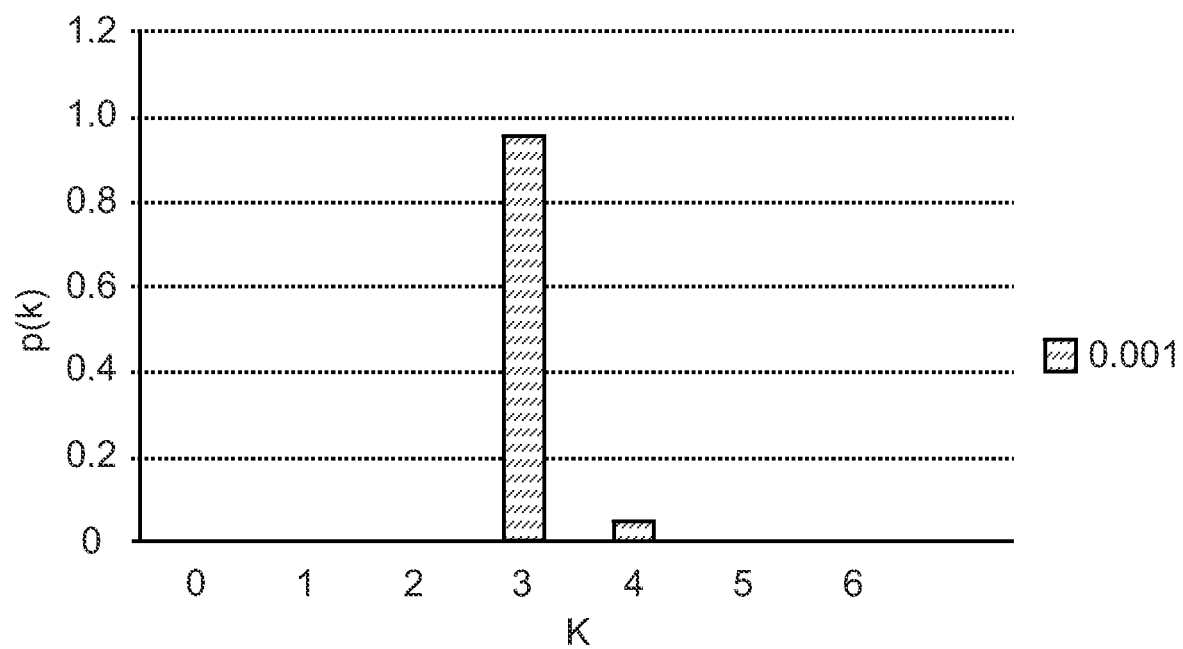
FIG. 9A-FIG. 9D are plots of the probability distribution of the number of K-harmonic signals found using the methods of the invention.
Figure 9B:
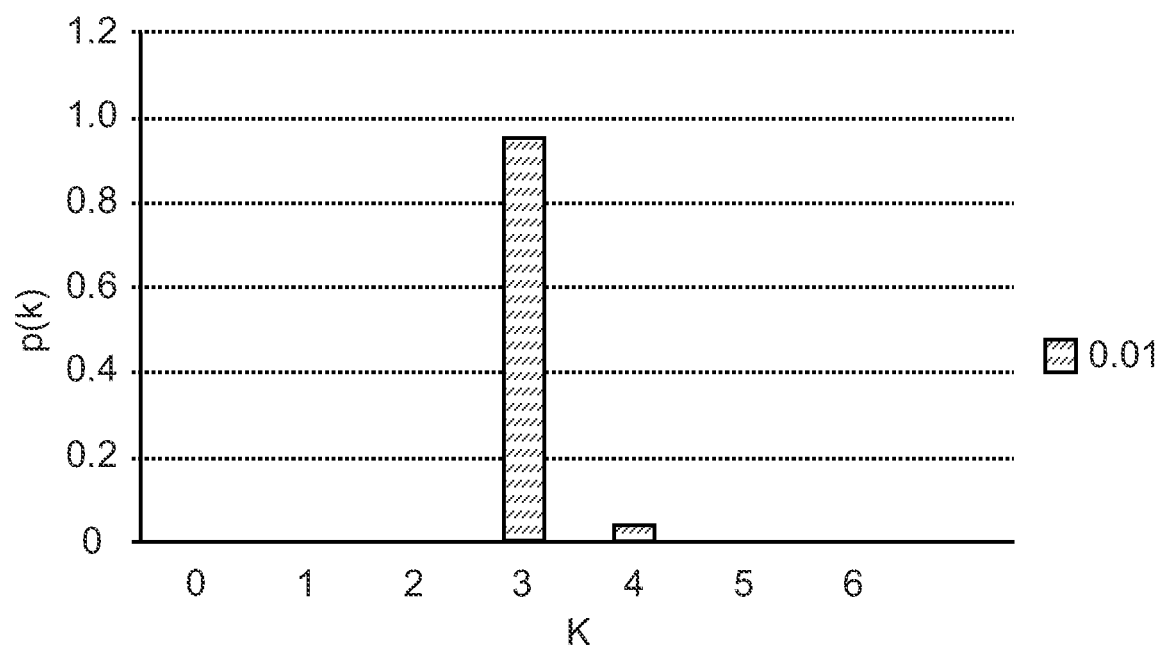
Figure 9C:
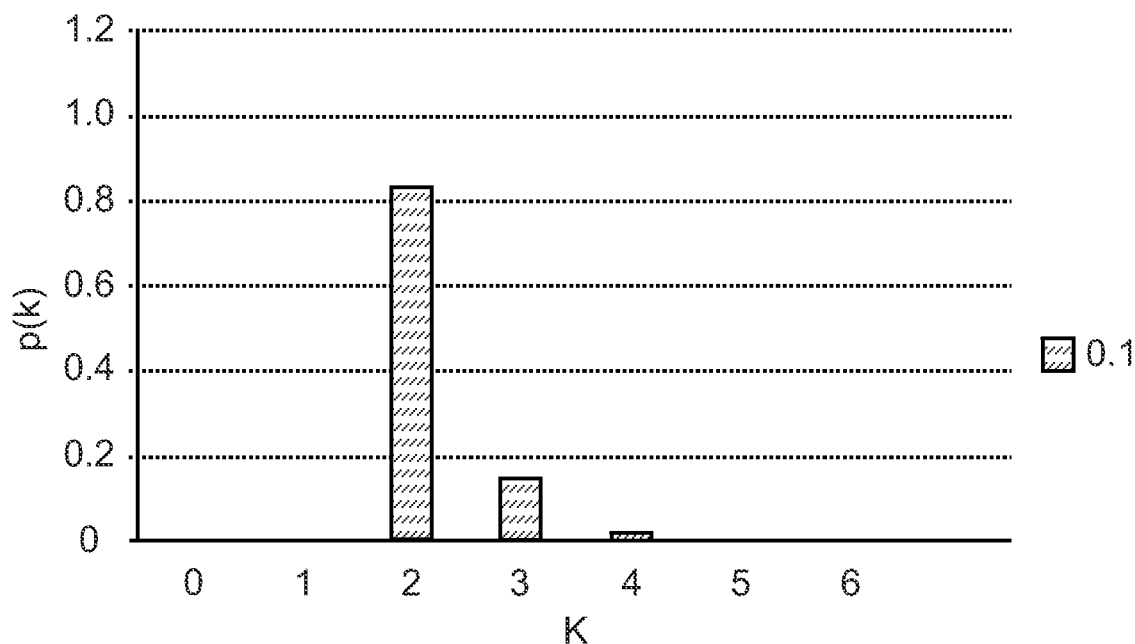
Figure 9D:
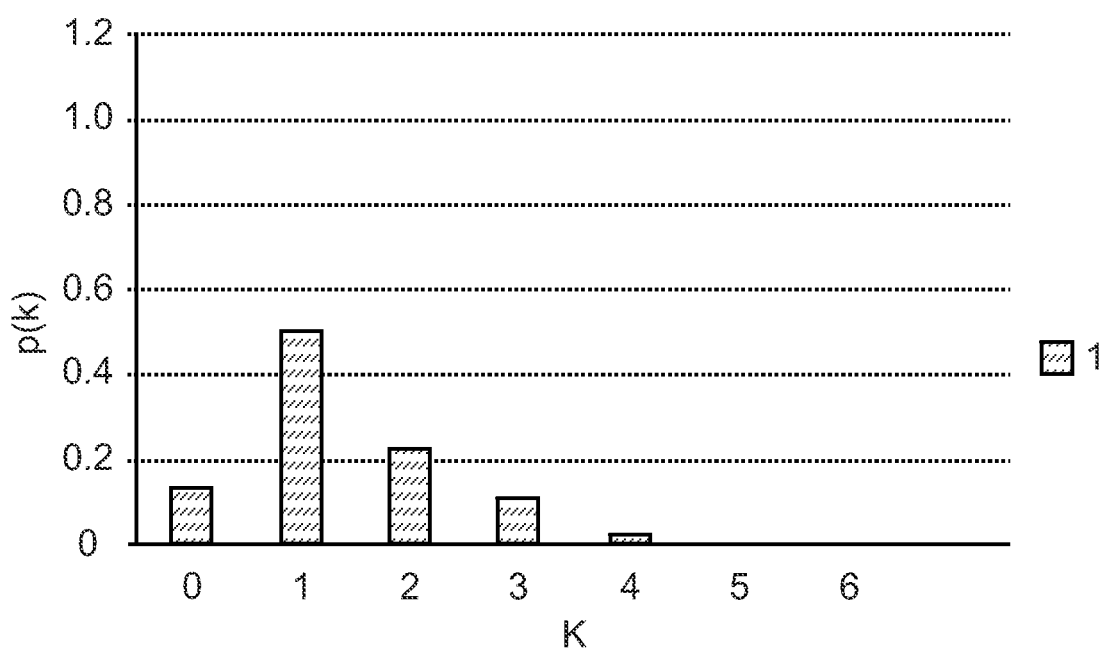
Figure 10A:
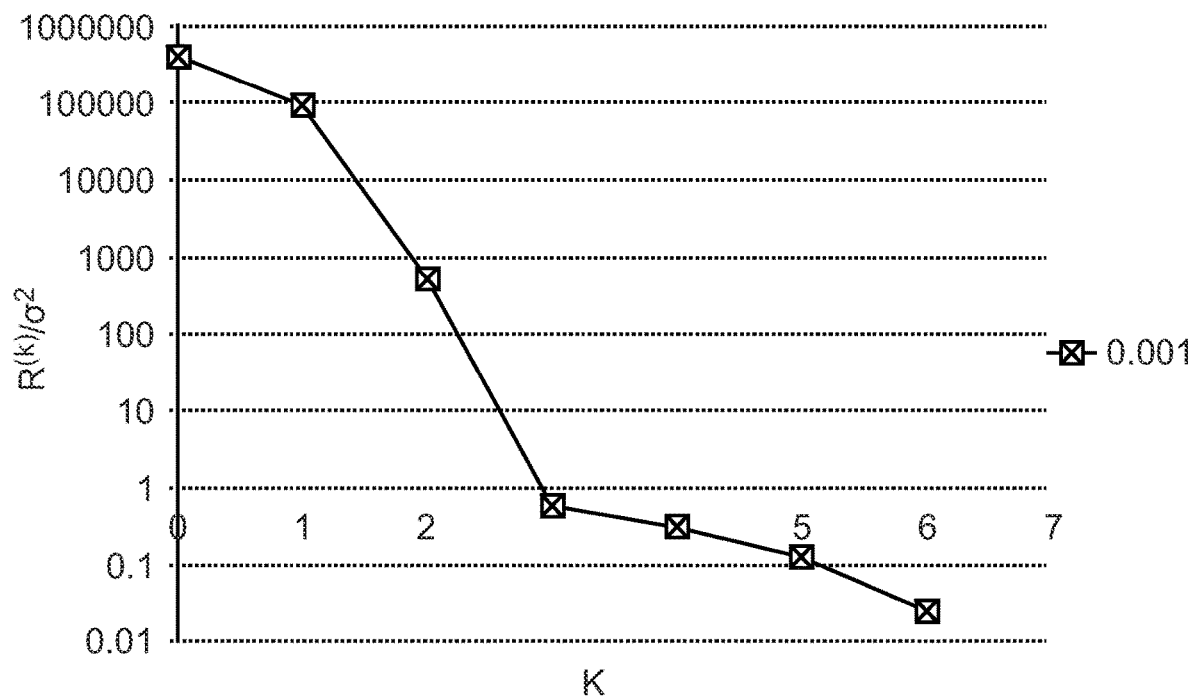
FIG. 10A-FIG. 10D are plots of the reduced residual, $R^{(K)}/\sigma^2$, vs. the number of harmonics, K.
Figure 10B:
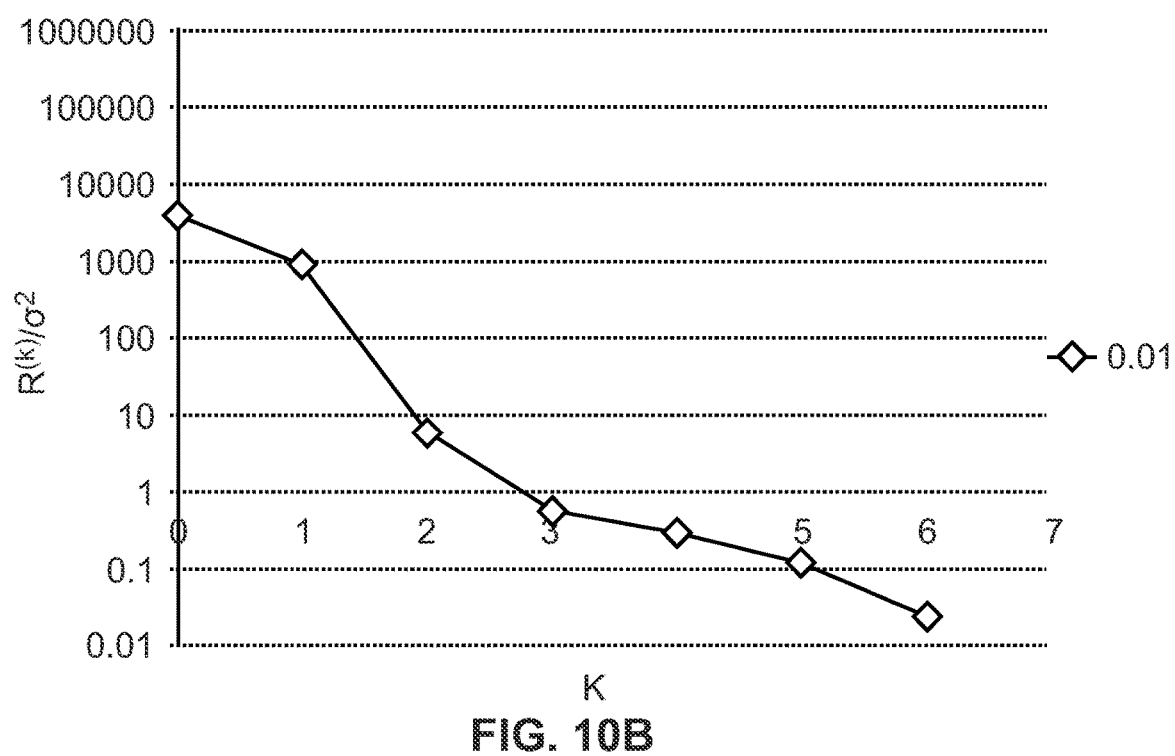
Figure 10C:
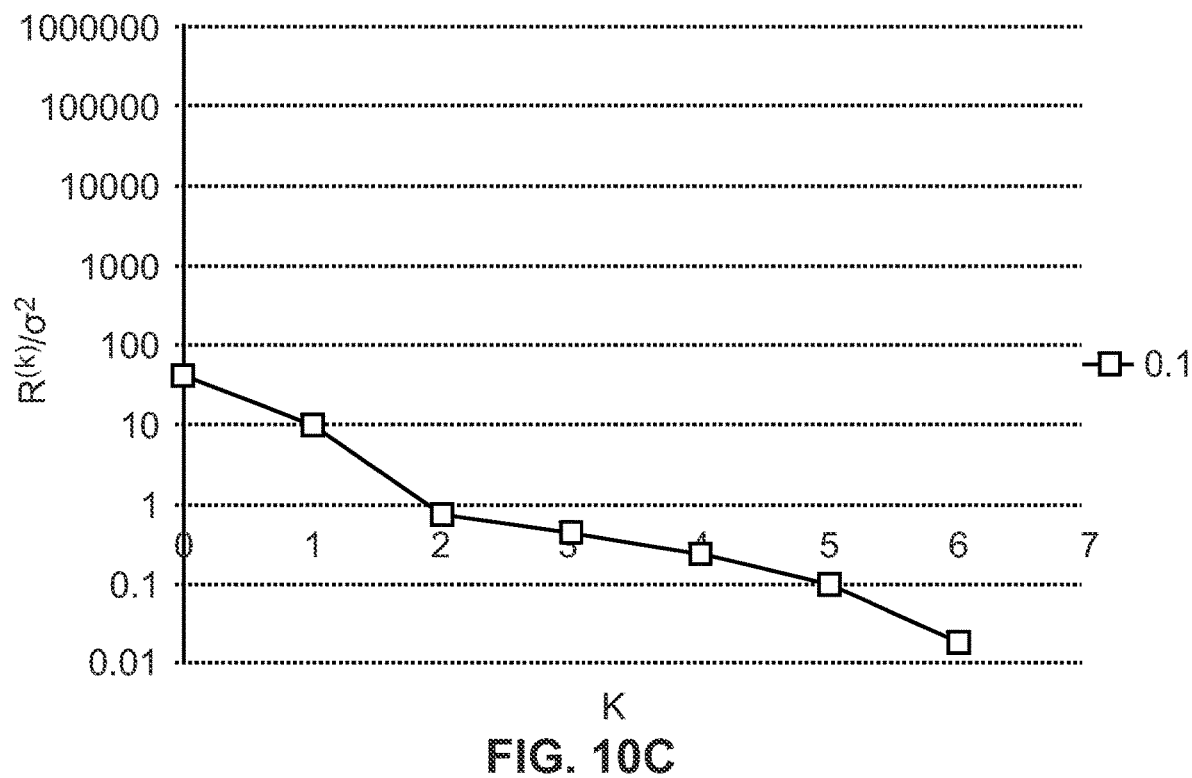
Figure 10D:
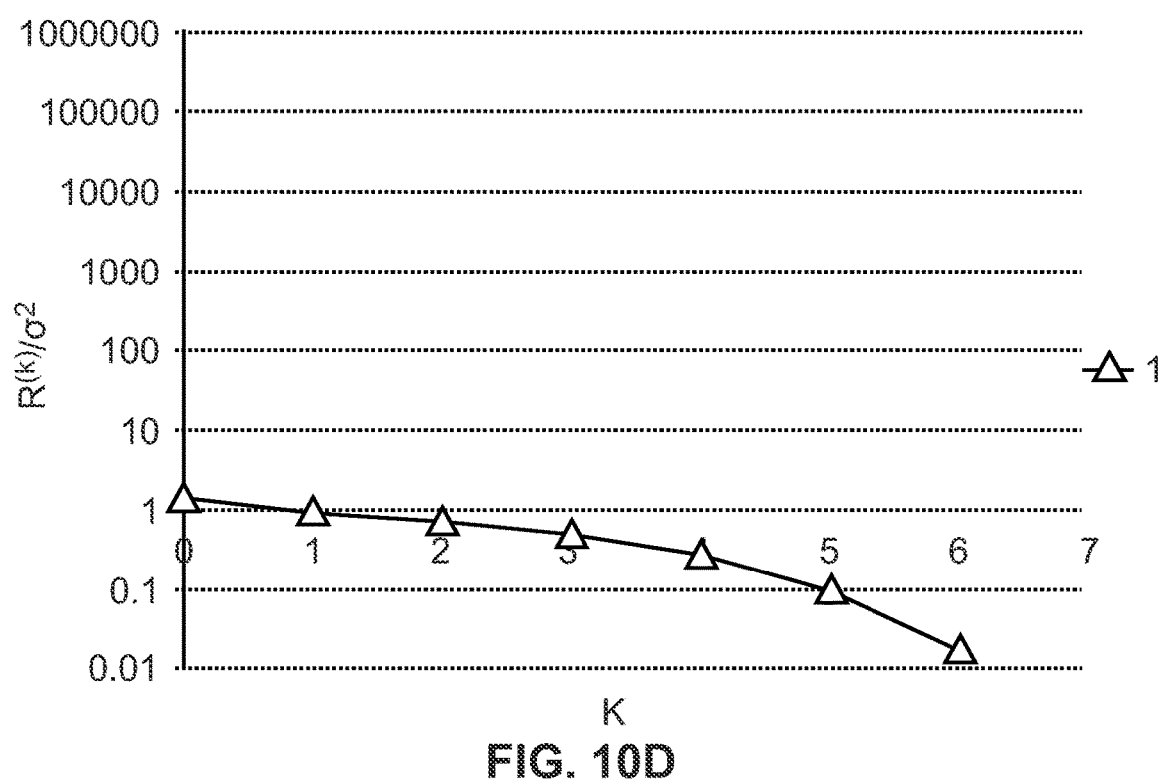

FIG. 7A and FIG. 8A are similar plots to that of FIG. 6A, and FIG. 7B and FIG. 8B are similar plots to that of FIG. 6B, but now the RMS noise deviations are such that $\sigma=0.01$ in FIGS. 7A-7B and $\sigma=0.1$ in FIGS. 8A-8B. As the noise increases relative to the signal, the method produces a wider range of amplitudes and frequencies as solutions. For $\sigma=0.01$ typically three peaks are still found by the method, but at $\sigma=0.1$ from some of the 1000 runs only two peaks are found. The range of amplitudes increases on increasing the noise, and at $\sigma=0.1$ is tending to be larger than 1.0. However the error bars on FIG. 8B indicates that the FT power spectrum would be extremely noisy under these conditions, and, of course, would still only have detected one peak.

FIG. 9A-FIG. 9D provides plots of the probability distribution of the number of K-harmonic signals found using the methods of the invention. For various different noise levels $\sigma$ (ranging from 0.001 to 1 as indicated), but only one particular noise distribution out of the 1000 used above in relation to FIGS. 5-8, the value p(K), the probability of the number of harmonics, is plotted against K, the number of harmonics. As described earlier, $p(K)=P(R^{(K)})-P(R^{(K-1)})$.

These graphs illustrate that whilst there are non-zero probabilities for an incorrect value of K to be found at all noise levels, the invented method, finding the most probable value for K, correctly finds K for $\sigma=0.001$ and $\sigma=0.01$. As the noise increases there is an increasing probability that a lower value of K will be found.

FIG. 10A-FIG. 10D provides plots of the reduced residual vs. the number of harmonics. Here, the reduced residual is $R^{(K)}/\sigma^2$, hence when the reduced residual equals 1 the residual $R^{(K)}=\sigma^2$. FIG. 10 shows $R^{(K)}/\sigma^2$ vs. K for various values of $\sigma$, and it can be seen that for increasing noise, the difference between the residual and the noise $\sigma$ is reduced over the range of K, indicating that it is more difficult to distinguish the difference between $R^{(K)}$ and the determined noise. FIG. 10 also shows graphically how the criterion for finding K is used. In a preferred method as already described, K is increased from 0 and $R^{(K)}$ is calculated repeatedly for different K until $R^{(K)}$ lies within them noise range. In a preferred method this is when $R^{(K)}$ first drops below the determined noise level. For $\sigma=0.001$ and $\sigma=0.01$, K is correctly found as $R^{(K)}$ first drops below the determined noise level at K=3.

Figure 11:
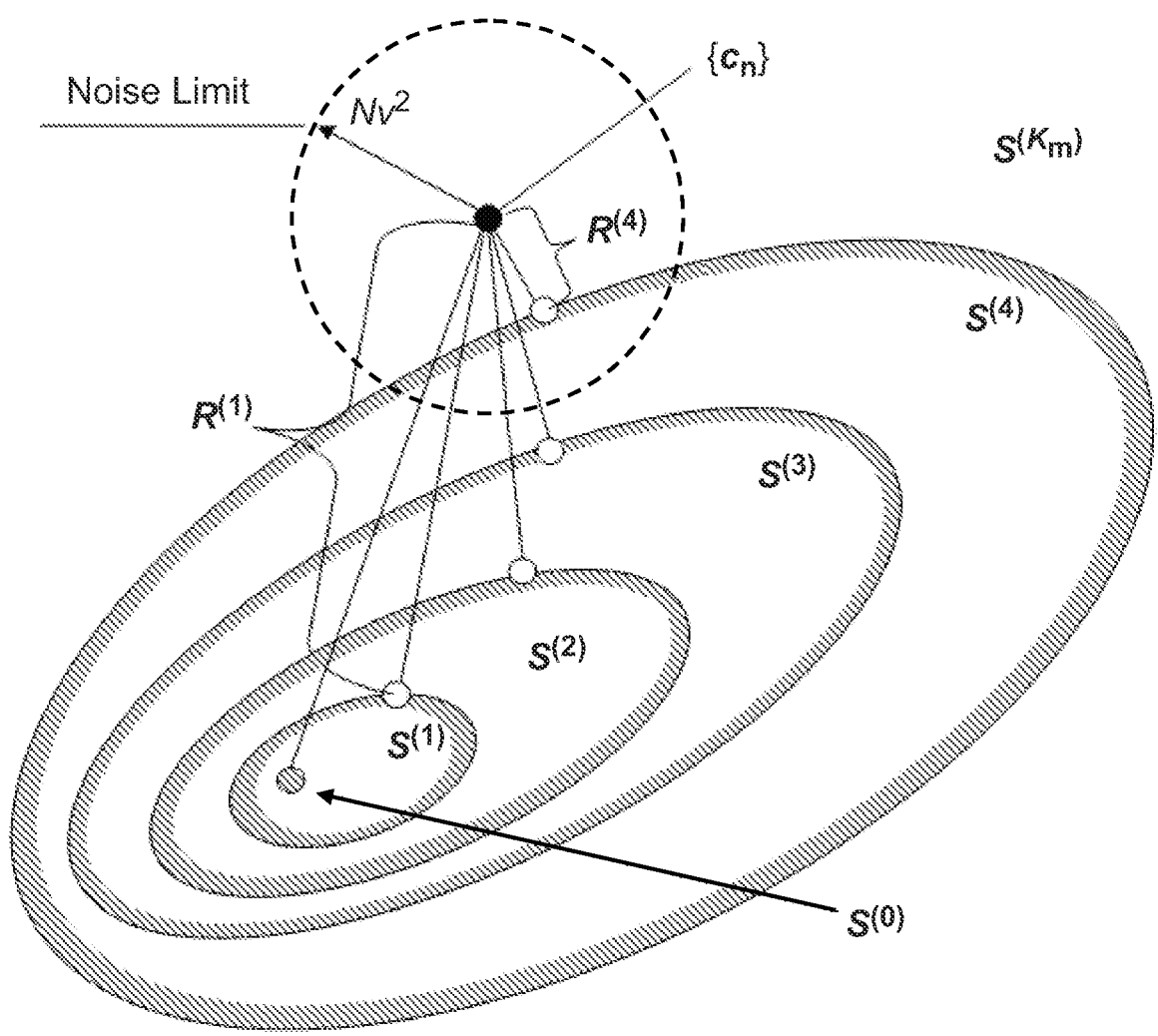
FIG. 11 schematically shows how the methods of the invention effectively find the optimum location in the space of K-harmonic signals $\mathbb{S}^K$ for each value of K so as to minimise the residual $R^{(K)}$.

FIG. 11 schematically illustrates how the invented methods, by minimizing the norm of equation (4), effectively find the optimum location in the space of K-harmonic signals $\mathbb{S}^K$ for each value of K so as to minimise the residual $R^{(K)}$. It can be seen how the residual $R^{(K)}$ is closest to the noise level (dotted circle) for the space of K-harmonic signals $\mathbb{S}^{(K)}$ where K=3.

A comparison of the methods of the invention with the FDM is shown in FIGS. 12A-12H under the additional constraint that the model signals have zero decay. A test signal again consisting of three sine waves having frequencies that differ by one half of a frequency bin was used, with added noise at four different signal-to-noise ratios (SNR). The test signals have frequencies at 0.5, 1.0 and 1.5 on the frequency bin scale (x), and each have amplitude 1.0 on the intensity scale (y). Once again, for each of the signal-to-noise ratios, 1000 different random noise data sets were added to the test signal and the methods of the invention, and the FDM, were used to determine K, f and A in each case. FIG. 12A, 12C, 12E, 12G show the results for the FDM, whilst FIGS. 12B, 12D, 12F and 12H show the results for the methods of the present invention.

Figure 12A:
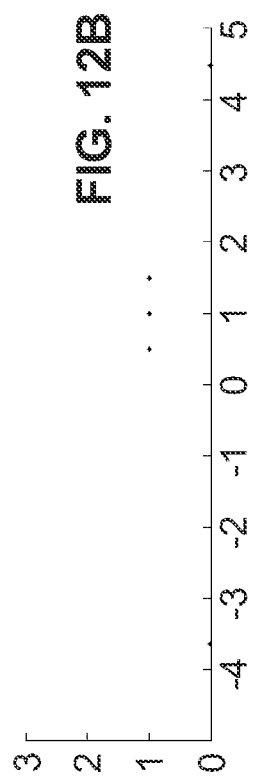
FIG. 12A shows a plot of peak amplitudes and frequencies found, using the FDM approach, in 1000 different generations of a three-sine-wave test signal including random noise at a signal-to-noise ratio (SNR) of 100000.
Figure 12C:
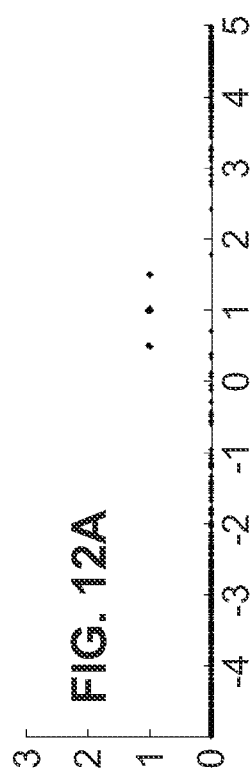
FIG. 12C is a plot of peak amplitudes and frequencies found, using the FDM approach, in 1000 different generations of the three-sine-wave test signal including random noise at SNR of 1000.
Figure 12E:
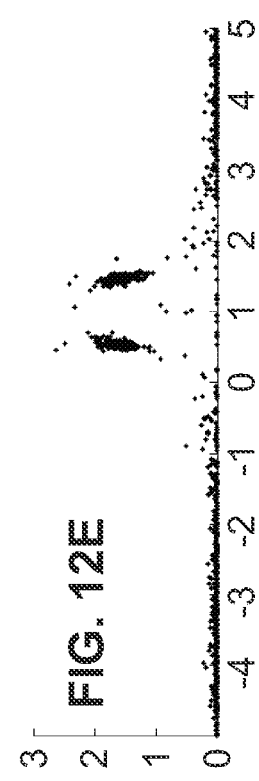
FIG. 12E is a plot of peak amplitudes and frequencies found, using the FDM approach, in 1000 different generations of the three-sine-wave test signal including random noise at SNR of 100.
Figure 12G:
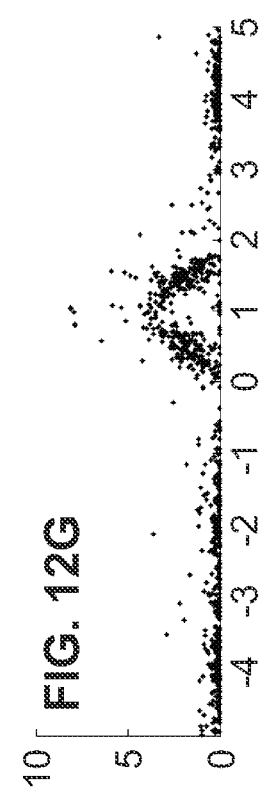
FIG. 12G is a plot of peak amplitudes and frequencies found, using the FDM approach, in 1000 different generations of the three-sine-wave test signal including random noise at SNR of 10.
Figure 12B:
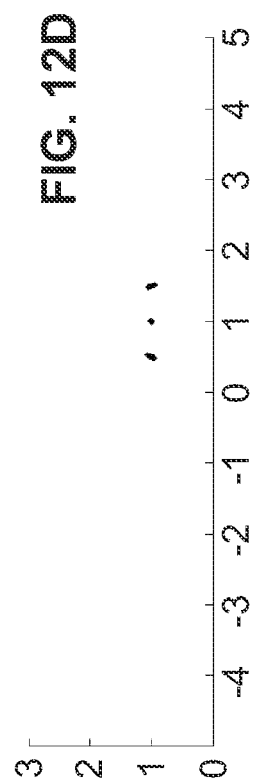
FIG. 12B is a plot similar to FIG. 12A for which the peak amplitudes and frequencies were found using the methods of the present invention.
Figure 12D:
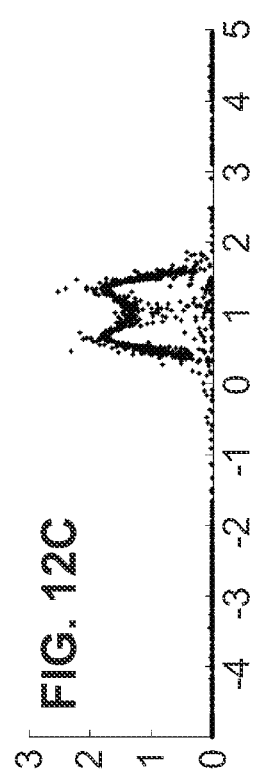
FIG. 12D is a plot similar to FIG. 12C for which the peak amplitudes and frequencies were found using the methods of the present invention.

FIGS. 12A and 12B compare the different methods for SNR=100000. It can be seen from FIG. 12B that the invented method finds three peaks (i.e. it determines that K=3), and that those peaks have, to a high degree of precision and accuracy, amplitudes of 1.0 and are at frequency bins 0.5, 1.0 and 1.5. No extraneous peaks appear to have been detected. In contrast, even at this very high SNR, the results in FIG. 12A show the FDM attributes a large number of extraneous peaks across the full frequency range plotted (−5.0 to +5.0), albeit with low amplitudes. At this SNR a further treatment of the FDM results is required to separate peaks which are due to signal from the spurious results of low amplitude. The FDM also finds three peaks, with amplitudes 1.0 and at frequency bin locations of 0.5, 1.0 and 1.5, however the spread in values of amplitude and frequency is a little larger, i.e. the precision is lower, than that produced by the invented methods.

At SNR=1000, a marked difference between the methods is very apparent. The FDM results, in FIG. 12C, again indicate a large number of extraneous peaks across the full frequency range, of low amplitude. Now, however, the uncertainty in the attribution of the three signal peaks has increased very significantly. For some of the 1000 different noise cases (all at SNR=1000) the FDM has found three peaks but with amplitudes ranging from near zero to ~2.5. In some cases the FDM has only found two peaks that might be attributed to signal and in some cases only one. The precision is very poor compared to the results of the invented methods shown in FIG. 12D. The invented methods find K=3 at all times and that each signal peak has amplitude 1 and appears at frequency bins 0.5, 1.0 and 1.5 with vastly greater precision than is found by the FDM.

Figure 12F:
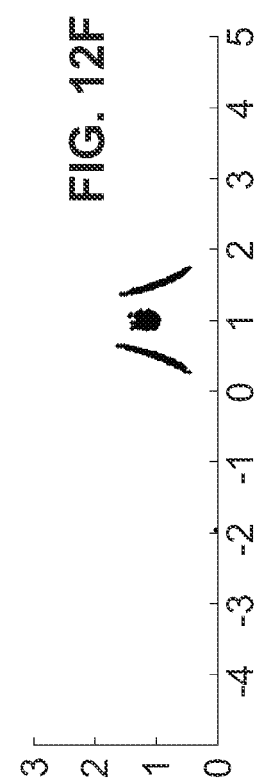
FIG. 12F is a plot similar to FIG. 12E for which the peak amplitudes and frequencies were found using the methods of the present invention.
Figure 12H:
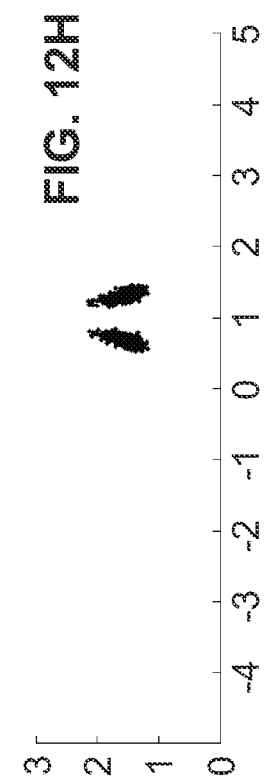
FIG. 12H is a plot similar to FIG. 12G for which the peak amplitudes and frequencies were found using the methods of the present invention.

As the SNR reduces further to SNR=100, FIG. 12E shows that the FDM predicts increasing amplitudes for the extraneous peaks spread across the frequency spectrum, and that there are, from visual inspection, just two peaks that might be attributed to signal, those peaks having amplitudes ranging from ~1 to ~2 and being at frequencies 0.5 and 1.5, i.e. the central signal peak is not predicted in almost all the 1000 runs. The results of the invented methods, in FIG. 12F, show three peaks are again found, having amplitudes ranging from ~0.5 to ~1.5 and being located close to the correct frequency bin locations. The precision has worsened. On rare occasions an extraneous peak of very low amplitude appears close to frequency bin −2. Visually, it would appear that the results in FIG. 12F are more helpful to the mass spectroscopist than those from the FDM even at a SNR which is ten times better.

At the very poor SNR of 10, the FDM predicts, in FIG. 12G, a wide range of spurious peaks right across the frequency range which have a wide range of amplitudes, some greatly exceeding 1. Two signal peaks might be identified in some cases, but the amplitudes range from near zero to ~8, and the frequency locations range from 0 to ~2. The invented methods produce results plotted in FIG. 12H which suggest only two peaks at frequency bins ~0.5 and ~1.5, of amplitudes ~1.2 to ~2.2.

It can be seen that the FDM produces many extraneous peaks at all SNR. To use the FDM in practical situations these must be distinguished from signal peaks, but it can be seen from FIG. 12 that the amplitudes of the spurious peaks vary significantly with the SNR and the range of amplitudes also varies, making the process of distinguishing more difficult. The results plotted in FIG. 12 show how the invented methods, by finding the most probable K taking into account a determined noise, do not thereby suffer the problem of spurious peaks which must in some way be later distinguished from signal peaks.

Methods of the present invention may also be applied to data from other types of spectroscopic analysis such as, for example, nuclear magnetic resonance (NMR), and infrared spectroscopy. In NMR the relaxation of the spins of atomic nuclei after excitation with electromagnetic pulses is recorded and the relaxation signals and their frequencies depend upon the surrounding of the nuclei, including the molecular structure. The observed spectroscopic frequencies (also called "lines" or "peaks") are for example influenced by the coupling between adjacent nuclei, leading to frequency shifts and/or line splitting. Observed Nuclear spins are typically those of Hydrogen (1H), 13C and the less common 15N, 31P, 19F. The details of the method and the common methods of data evaluation are set out in various text books, including D. H. Williams and I. Fleming: "Spectroscopic methods in organic chemistry", 4th ed., London 1989 (which additionally contains a chapters on UV, visible and infrared spectroscopy).

Whilst, as already described, in mass spectrometry such as FT-MS the detected frequencies are usually representative of the mass-to-charge of ions, the ions following periodic motion within the mass analyser, and frequency differences correspond to mass-to-charge differences, in NMR the frequencies are representative of spin relaxation frequencies (i.e. the difference between the various, possibly split, excited state and ground state nuclear spin energy levels) and the differences are indicative of nuclear spin coupling energies and various other effects of the surroundings of a nucleus that have influence on the energy levels.

The frequency range of NMR signals, following heterodyning, is relatively small compared to the range encountered in mass spectrometry, and the methods of the present invention are well suited for decomposing spectral harmonic signals from such data, to directly provide chemical shifts and line broadening information.

As with Fourier Transform and FDM, methods of the present invention may also be extended into higher dimensions, such as, for example, two dimensional NMR. While in the most simplistic way the chemical shifts and broadenings (i.e. frequencies and line-widths) may be determined on a per-spectrum basis and the data simply "stacked" in the additional dimension, preferably the data is directly handled in multiple dimensions, as it is for example in synthetic aperture radar (SAR) applications (Carrara et al. Spotlight Synthetic Aperture Radar, Boston 1995), or in conventional 2-D FT-NMR applications (see e.g. Peter Güntert, Volker Dötsch, Gerhard Wider and Kurt Wüthrich: "Processing of multi dimensional NMR data with the new software PROSA"; Journal of Biomolecular NMR, 2 (1992) 619-629). Examples of the extension to additional dimensions using the FDM are provided by Vladimir A. Mandelshtam, Howard S. Taylor, and A. J. Shaka: "Application of the Filter Diagonalization Method to One- and Two-Dimensional NMR Spectra"; Journal of Magnetic Resonance 133, 304-312 (1998), article number. MN981476. Such direct multidimensional processing has, inter alia, the advantage of better localization of the frequencies in the multiple dimensions and correct abstraction from or interpolation between the separate spectra. A further advantage is improved signal-to-noise ratio.

Pre-processing using conventional fast Fourier transform methods may be used to guide the sectioning of the two-dimensional data for optimum processing by the method of the invention, e.g. aid the selection of rectangles in frequency and time to be processed together. It may also be used to control subsequent acquisitions within the same experiment, e.g. data dependent ion selection and/or fragmentation in mass spectrometry or e.g. re-acquisitions with adjusted settings (pulse sequences) in 2D-NMR spectrometry.

Both the basic method of the invention and it's extension to multiple dimensions may—in addition to the improved determination of frequencies (i.e. masses, IR spectral lines, chemical shifts, radar objects etc.) and intensities—be used as a means for optimal data compression in recorded data by retaining only the K identified frequency/intensity datasets, preferably together with aggregate information on the noise/background, such as 'sigma' used during the determination of K.

Accordingly in another aspect the present invention provides a method of spectrometry comprising:

providing measured data comprising a combination of periodic signals and noise measured over time using a spectrometer;

determining a quantity representative of the noise in the measured data, and determining a model data set of K-harmonic component signals from the measured data;

wherein the harmonic component signals and their number K are determined iteratively on the basis of:
(i) using an initial value of K to calculate a minimised non-negative measure of difference $R^{(K)}$ between the measured data and model data comprising data sets of K-harmonic component signals, and
(ii) if $R^{(K)}$ does not lie within a noise range based upon the quantity representative of noise, changing the value of K and recalculating $R^{(K)}$ as many times as necessary until $R^{(K)}$ does lie within the noise range;

and deriving spectroscopic information from the model data set, the spectroscopic information comprising one or more of: a measure of the number of harmonic component signals; a measure of the frequencies of the harmonic component signals; a measure of the signal intensity of the harmonic component signals.

The method of spectrometry may comprise a method of mass spectrometry, a method of NMR spectroscopy, or a method of infrared spectroscopy. The spectroscopic information from the model data set in NMR spectroscopy methods may further comprise resonance frequencies, chemical shifts and intensity (abundance) information concerning the nuclei. The spectroscopic information from the model data set in infrared spectroscopy methods may further comprise absorption frequencies and intensity (abundance) information concerning chemical groups.

The present invention still further provides a method of data compression comprising decomposing measured data comprising signal and noise measured over time using a spectrometer into a sum of K harmonic component signals and a noise component, wherein the harmonic component signals and their number K are derived from the measured data and a determined quantity representative of the noise in the measured data.

As used herein, including in the claims, unless the context indicates otherwise, singular forms of the terms herein are to be construed as including the plural form and vice versa.

Throughout the description and claims of this specification, the words "comprise", "including", "having" and "contain" and variations of the words, for example "comprising" and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

What is claimed is:

1. A method of operating a mass spectrometer comprising an Orbital Trap mass analyzer or a Fourier Transform Ion Cyclotron Resonance (FT-ICR) mass analyzer, the method comprising:
   generating a plurality of species of ions using an ion source of the mass spectrometer, the species being within a range of mass-to-charge ratios;
   introducing the plurality of species into the Orbital Trap or FT-ICR mass analyzer such that the plurality of species undergo periodic motion within a range of frequencies within the Orbital Trap or FT-ICR mass analyzer;
   acquiring transient data comprising signal and noise measured over time that has been obtained from detection of an image current generated by the periodic motions of the plurality of species of ions within the Orbital Trap or FT-ICR mass analyzer;
   determining a quantity representative of the noise from the acquired transient data;
   determining a noise range based upon the quantity representative of the noise;
   determining a model data set of K-harmonic component signals from the acquired transient data, each component signal comprising a complex-valued amplitude that includes phase information and a complex-valued frequency that includes time decay information,
   wherein the harmonic component signals and their number K are determined iteratively on the basis of:
      using an initial value of K to calculate a minimized nonnegative measure of difference $R^{(K)}$ between the acquired transient data and model data comprising data sets of K-harmonic component signals; and
      if $R^{(K)}$ does not lie within the noise range, changing the value of K and recalculating $R^{(K)}$ as many times as necessary until $R^{(K)}$ does lie within the noise range;
   generating mass spectral information about the ion species from the model data set, the mass spectral information comprising, for each of the K harmonic component signals, a mass-to-charge ratio and an estimate of a number of ions of a respective corresponding species of ions; and
   controlling subsequent acquisitions of the mass analyzer using the generated mass spectral information,
   wherein either a resolution of the mass-to-charge ratios of the generated mass spectral information utilized for controlling the subsequent acquisitions is greater than a resolution of mass-to-charge ratios calculated by a Fast Fourier Transform method, or
   the mass-to-charge ratios of the generated mass spectral information have fewer artifacts relative to mass spectral information generated using a Filter Diagonalization method.

2. The method according to claim 1 wherein the measure of difference $R^{(K)}$ comprises a minimized normalized sum of residuals between the acquired transient data and the model data at a plurality of data points.

3. The method according to claim 1 wherein $R^{(K)}$ is recalculated for increasing values of K starting from an initial value of 0.

4. The method according to claim 1 wherein $R^{(K)}$ is recalculated for decreasing values of K starting from an initial value.

5. The method according to claim 1 wherein an initial value for K is determined from a number of peaks in the frequency domain spectrum of the acquired transient data.

6. The method according to claim 1 wherein the value of K is changed and $R^{(K)}$ is recalculated until the value of K is the minimum value of K for which $R^{(K)}$ is less than, or is equal to, the quantity representative of the noise.

7. The method according to claim 1 wherein the value of K is changed and $R^{(K)}$ is recalculated until $R^{(K)}$ becomes the closest value to the quantity representative of the noise.

8. The method according to claim 1 wherein the quantity representative of the noise comprises a noise power and the noise power is determined by a method comprising one or more of: evaluating the noise power from the acquired transient data; evaluating the noise power from a previous or another set of data acquired from the mass analyzer; measuring characteristics of preamplifiers used in the data measuring apparatus of the mass analyzer; setting a noise power on the basis of prior knowledge of the mass analyzer.

9. The method according to claim 1 wherein the model data set comprises a harmonic signal which may be described by a sum of K complex exponential terms each multiplied by complex amplitudes, and the K harmonic signals are derived assuming the harmonic signal possesses autocorrelative properties.

10. The method according to claim 1 wherein the measure of difference $R^{(K)}$ is described by a term or terms involving:

$$\min \frac{1}{N} \sum_{n=0}^{N-1} |c_n - c_n^*|^2,$$

where $c_n$ is acquired data at each of N data points, and $c_n^*$ is the K-harmonic signal at each of N data points in the model data set.

11. The method according to claim 1, wherein the generating of the mass-to-charge ratios of the species of ions includes determining the mass-to-charge ratios of the K species of ions by performing the steps of:
   deriving a set of autocorrelation coefficients, a, relating terms $c_n^*$ according to $a_0 c_n^* + a_1 c_{n+1}^* + \ldots + a_K c_{n+K}^* = 0$, where $c_n^*$ is the K-harmonic signal at acquired data points in the model data set;
   combining the autocorrelation coefficients, a, in a polynomial equation of the form $a_0 + a_1 \lambda + a_2 \lambda^2 \ldots + a_K \lambda^K = 0$ where $\lambda$ is a complex number;
   deriving the frequencies of the K harmonic signals from the roots, $\lambda_k$, of the polynomial equation; and
   translating each of the K frequencies of the K harmonic signals from the frequency to the mass-to-charge domain.

12. The method according to claim 11, wherein the generating of mass spectral information about the ion species includes determining an estimate of the number of ions of each species within the Orbital Trap or FT-ICR mass analyzer, wherein the number of ions of each species is determined from the amplitudes of the K-harmonic signals, the amplitudes being found by minimization of the residual R, where R is of the form $$R = \left(\frac{1}{N}\right) \sum_n \left| c_n - \sum_k A_k (\lambda_k)^n \right|^2,$$

and $c_n$ is acquired data at each of N data points.

13. The method according to claim 1 wherein the acquired transient data corresponds to periodic motions of ions of a limited range of mass-to-charge ratios selected from a larger range of mass-to-charge ratios, said larger range of mass-to-charge ratios corresponding to a larger transient data set.

14. The method of claim 13 wherein the transient data corresponding to the restricted range of mass-to-charge ratios is selected from the larger transient data set by a method comprising:
    obtaining a frequency spectrum of the larger transient data set to form a transformed data set;
    selecting a range of frequencies in the frequency domain spectrum of the transformed data set to form a transformed data subset, and;
    transforming the transformed data subset back into the time domain to form the acquired transient data.

15. The method according to claim 1, wherein generating of mass spectral information about the ion species from the model data set includes deriving a mass spectrum from the model data set comprising a set of K harmonic component signals.

16. A mass spectrometer system including an Orbital Trap or FT-ICR mass analyzer comprising:
    an ion source that, in operation, generates a plurality of species of ions within a range of mass-to-charge ratios, each species having a different mass-to-charge ratio, wherein the Orbital Trap or FT-ICR mass analyzer receives the generated plurality of species of ions; and
    a computer electronically coupled to the Orbital Trap or FT-ICR mass analyzer so as to receive, from the Orbital Trap or FT-ICR mass analyzer, acquired transient data comprising signal and noise measured over a time duration and acquired from an image current generated by the Orbital Trap or FT-ICR mass analyzer as a result of periodic motions of the plurality of species of ions within a range of frequencies within the mass analyzer over the time duration,
    wherein the computer is configured to:
        determine a quantity representative of the noise from the acquired transient data;
        determine a noise range based upon the quantity representative of the noise;
        determine a model data set of K-harmonic component signals from the acquired transient data, each component signal comprising a complex-valued amplitude that includes phase information and a complex-valued frequency that includes time decay information, wherein the harmonic component signals and their number K are determined iteratively by:
            using an initial value of K to calculate a minimized non-negative measure of difference $R^{(K)}$ between the acquired transient data and model data comprising data sets of K-harmonic component signals, and
            if $R^{(K)}$ does not lie within the noise range, changing the value of K and recalculating as many times as necessary until $R^{(K)}$ does lie within the noise range;
        generate mass spectral information about the ion species from the model data set, the mass spectral information comprising, for each of the K harmonic component signals, a mass-to-charge ratio and an estimate of a number ions of a respective corresponding species of ions; and
    control subsequent acquisitions of the mass analyzer using the generated mass spectral information,
    wherein either a resolution of the mass to charge ratios of the generated mass spectral information utilized for controlling the subsequent acquisitions is greater than a resolution of mass-to-charge ratios calculated by a Fast Fourier Transform method, or
    the mass-to-charge ratios of the generated mass spectral information have fewer artifacts relative to mass spectral information generated from a Filter Diagonalization method.

\* \* \* \* \*

UNITED STATES PATENT AND TRADEMARK OFFICE
CERTIFICATE OF CORRECTION

PATENT NO. : 10,840,073 B2
APPLICATION NO. : 13/829562
DATED : November 17, 2020
INVENTOR(S) : Aizikov et al.

It is certified that error appears in the above-identified patent and that said Letters Patent is hereby corrected as shown below:

In the Claims

Column 33, Claim 1, Line 35: delete "nonnegative" and insert --non-negative-- therefore.

Column 34, Claim 11, Line 41: delete "coefficients, a," and insert --coefficients, $a$,-- therefore.

Column 34, Claim 11, Line 42: delete "$a_0 c_n^* + a_1 c_{n+1}^* + .. + a_K c_{n+K}^* = 0,$" and insert --$a_0 c_n^* + a_1 c_{n+1}^* + .. + a_K c_{n+K}^* = 0,$-- therefore.

Column 34, Claim 11, Line 45: delete "coefficients, a," and insert --coefficients, $a$,-- therefore.

Column 34, Claim 11, Line 46: delete "$a_0 + a_1\lambda + a_2\lambda^2 ... + a_K\lambda^K = 0,$" and insert --$a_0 + a_1\lambda + a_2\lambda^2 ... + a_K\lambda^K = 0,$--.

Column 35, Claim 14, Line 15: delete "subset, and;" and insert --subset; and-- therefore.

Column 36, Claim 16, Line 19: delete "recalculating" and insert --recalculating $R^{(K)}$-- therefore.

Column 36, Claim 16, Line 30: delete "mass to charge" and insert --mass-to-charge-- therefore.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*